(12) United States Patent
Hasegawa

(10) Patent No.: US 6,825,731 B2
(45) Date of Patent: Nov. 30, 2004

(54) VOLTAGE CONTROLLED OSCILLATOR WITH FREQUENCY STABILIZED AND PLL CIRCUIT USING THE SAME

(75) Inventor: Masaru Hasegawa, Tokyo (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 10/104,859

(22) Filed: Mar. 22, 2002

(65) Prior Publication Data

US 2002/0140504 A1 Oct. 3, 2002

(30) Foreign Application Priority Data

Mar. 27, 2001 (JP) ........................................ 2001/091461

(51) Int. Cl.[7] .................................................. H03B 5/24
(52) U.S. Cl. ...................... 331/57; 331/175; 331/177 R
(58) Field of Search .............................. 331/34, 46, 48, 331/50, 57, 175, 177 R, 185, DIG. 2; 327/280, 281, 147, 156–163; 375/373–376

(56) References Cited

U.S. PATENT DOCUMENTS

| | | | |
|---|---|---|---|
| 5,559,473 A | * 9/1996 | Anderson et al. | 331/34 |
| 5,568,099 A | 10/1996 | Du | 331/57 |
| 5,635,878 A | * 6/1997 | Liu et al. | 331/57 |
| 5,686,867 A | * 11/1997 | Sutardja et al. | 331/57 |
| 5,714,912 A | * 2/1998 | Fiedler et al. | 331/57 |
| 6,043,719 A | * 3/2000 | Lin et al. | 331/57 |
| 6,229,403 B1 | * 5/2001 | Sekimoto | 331/57 |

FOREIGN PATENT DOCUMENTS

| | | |
|---|---|---|
| JP | A H8-125531 | 5/1996 |
| JP | A H11-177416 | 7/1999 |

OTHER PUBLICATIONS

Notani, Hiromi, et al. "A 622–MHz CMOS Phase=Locked Loop with Precharge–type Phase Frequency Detector" [1994 Symposium on VLSI Circuits Digest of Technical Papers, pp. 129–130.].

*High–Speed–Wide–Locking Range VCO with Frequency Calibration*, by: Takeo Yasuda; Published in: IEICE Transactions on Fundamentals of Electronics, Communications and Computer Sciences, Institute of Electronics Information and Comm. Eng. Tokyo, Japan, vol. E83–A, No. 12, Dec. 2000, pp. 2616–2622, XP001036415; ISSN: 0916–8508.

* cited by examiner

Primary Examiner—Minh Nguyen
(74) Attorney, Agent, or Firm—Hayes Soloway P.C.

(57) ABSTRACT

A voltage controlled oscillator includes N (N is an integer equal to or more than 2) inversion-type differential amplifiers and a level converter. The N (N is an integer equal to or more than 2) inversion-type differential amplifiers are connected in a loop such that each of output signals outputted from one of the N inversion-type differential amplifiers has an opposite polarity to a corresponding one of output signals outputted from the next one of the N inversion-type differential amplifiers. The level converter is connected to one of the N inversion-type differential amplifiers as a last inversion-type differential amplifier to generate an oscillation signal from the output signals outputted from the last inversion-type differential amplifier. Each of the N inversion-type differential amplifiers operates in response to a predetermined voltage and a control voltage.

29 Claims, 15 Drawing Sheets

US 6,825,731 B2

VOLTAGE CONTROLLED OSCILLATOR WITH FREQUENCY STABILIZED AND PLL CIRCUIT USING THE SAME

BACKGROUND OF THE INVENTION

1. Field of the Invention

The present invention relates to a voltage controlled oscillator, and more particularly, to a voltage controlled oscillator which can suppress the deviation of an oscillation frequency.

2. Description of the Related Art

A typical voltage controlled oscillator (VCO) generates an output signal oscillating at a frequency determined in accordance with a voltage supplied from an external unit. For example, the voltage controlled oscillator (VCO) is used in various fields such as information processing and communication.

A conventional voltage controlled oscillator (VCO) will be described with reference to FIG. 1. FIG. 1 is a circuit diagram showing the circuit structure of the conventional voltage controlled oscillator (VCO). Referring to FIG. 1, the conventional voltage controlled oscillator (VCO) 105 is comprised of a bias generator (BG) 108, a ring oscillator (RO) 109, and a level converter (L-C) 107.

A constant voltage $V_{cnl}$ with a predetermined voltage value and a control voltage $V_{cnt}$ are supplied from an external unit to the bias generator (BG) 108. Also, a power supply voltage is supplied to the bias generator (BG) 108 and the ring oscillator (RO) 109 from an external unit. The outputs of the bias generator (BG) 108 are supplied to the ring oscillator (RO) 109. The bias generator (BG) 108 compensates for the operation current of the ring oscillator (RO) 109. The compensation means to flow the current enough to rapid rising and falling operations of the ring oscillator (RO) 109. Through this compensation, a high frequency characteristic can be improved. The level converter (L-C) 107 generates an output signal $F_{VCO}$ based on the outputs of the ring oscillator (RO) 109.

The ring oscillator (RO) 109 is comprised of N inversion-type differential amplifier. Here, N is an integer equal to or more than 2. Each of the N inversion-type differential amplifiers operates based on the outputs of the bias generator (BG) 108. That is, the operation current of each of the N inversion-type differential amplifiers is indirectly determined by the addition of a current $I_{cnl}$ determined in accordance with the constant voltage $V_{cnl}$ and a current $I_{cnt}$ determined in accordance with the control voltage $V_{cnt}$. In this way, in the ring oscillator (RO) 109, an offset of the oscillation frequency is set based on the constant voltage $V_{cnl}$, and the oscillation frequency is proportional to the voltage $V_{cnt}$. The ring oscillator (RO) 109 supplies one of the maximum voltage $V_{OUT1}$ showing the maximum peak and the minimum voltage $V_{OUT2}$ showing the minimum peak to the level converter (L-C) 107 through a first output terminal OUT1. Also, the ring oscillator (RO) 109 supplies the other of the maximum voltage $V_{OUT1}$ and the minimum voltage $V_{OUT2}$ to the level converter (L-C) 107 through a second output terminal OUT2.

The level converter (L-C) 107 increases voltage difference between the minimum voltage $V_{OUT2}$ and the maximum voltage $V_{OUT1}$ to a CMOS level and generates the output signal $F_{VCO}$. The output signal $F_{VCO}$ generated by the level converter (L-C) 107 is sent out outside as the output signal of the voltage controlled oscillator (VCO) 105.

A relation of the oscillation frequency of the output signal $F_{VCO}$ generated by the voltage controlled oscillator (VCO) 105 and the control voltage $V_{cnt}$ will be described. FIG. 3 is a diagram showing the relation. Referring to FIG. 3, when the voltage $V_{cnt}$ increases more than a threshold voltage $V_{a101}$ of a transistor contained in the voltage controlled oscillator (VCO) 105, the oscillation frequency of the output signal $F_{VCO}$ starts to increase linearly from 0 (Hz), as shown by the symbol X1. Thus, the voltage controlled oscillator (VCO) 105 generates the output signal $F_{VCO}$ with the oscillation frequency proportional to the control voltage $V_{cnt}$ in a range from the threshold voltage $V_{a101}$ to the power supply voltage $V_{DD}$. Therefore, when the control voltage $V_{cnt}$ is $V_{b101}$ ($V_{a101} < V_{b101} < V_{DD}$), the output signal $F_{VCO}$ of a desired oscillation frequency $F_{b101}$ can be obtained.

However, the voltage $V_{b101}$ receives interference due to a noise component and changes. At that time, the change of the desired oscillation frequency $F_{b101}$ becomes large in accordance with the inclination of the frequency characteristic, because the inclination of the frequency characteristic shown by the symbol X1 is steep. To suppress the large change of the oscillation frequency, an offset frequency $F_{a101}$ is presented by the addition of the current $I_{cnt}$ corresponding to the constant voltage $V_{cnt}$ in the bias generator (BG) 108. The offset frequency $F_{a101}$ is larger than 0 (Hz) and is smaller than the desired frequency $F_{b101}$, and is referred to as a reference frequency or a free-running oscillation frequency. Thus, the voltage controlled oscillator (VCO) 105 can generate the output signal $F_{VCO}$ to have frequency characteristic shown by the symbol Y101 which is more gentle than the frequency characteristic shown by the symbol X1.

Next, the bias generator (BG) 108 will be described. The bias generator (BG) 108 is comprised of an addition circuit 108a and a mirror circuit 108b.

The addition circuit 108a is comprised of a P-channel MOS (PMOS) transistor 111, and N-channel MOS (NMOS) transistors 112 and 113. The higher side power supply voltage $V_{DD}$ is connected with the source electrode of the PMOS transistor 111. The drain electrode of the PMOS transistor 111 is connected with the drain electrodes of the NMOS transistors 112 and 113. The constant voltage $V_{cnl}$ is supplied to the gate electrode of the NMOS transistor 112 from the external unit. Also, the source electrode of the NMOS transistor 112 is connected with the lower power supply voltage, and generally is grounded. The voltage $V_{cnt}$ is supplied to the gate electrode of the NMOS transistor 113 from the external unit. Also, the source electrode of the NMOS transistor 113 is connected with the lower power supply voltage, and generally is grounded.

The mirror circuit 108b is comprised of a PMOS transistor 114 and an NMOS transistor 115. The higher power supply voltage $V_{DD}$ is connected with the source electrode of the PMOS transistor 114. The gate electrode of the PMOS transistor 114 is connected with the drain electrode of the PMOS transistor 111. The drain electrode of the NMOS transistor 115 is connected with the drain electrode of the PMOS transistor 114. Also, the source electrode of the NMOS transistor 115 is connected with the lower power supply voltage, and generally is grounded.

The mirror circuit flows through a second transistor connected with a first transistor, the current with the same value as the value of current which flows through the first transistor or a value proportional to the value of current which flows through the first transistor like a mirror. The current which flows through the second transistor increases proportionally, if the current which flows through the first transistor increases. Therefore, the output of the PMOS transistor 111 is supplied from the bias generator (BG) 108 to the ring oscillator (RO) 109 as a signal corresponding to an addition of the current $I_{cnl}$ determined in accordance with the constant voltage $V_{cnl}$ and the current $I_{cnt}$ determined in accordance with the voltage $V_{cnt}$. Also, the output of the PMOS transistor 114 is supplied from the bias generator (BG) 108 to the ring oscillator (RO) 109.

Next, the ring oscillator (RO) 109 will be described. In the conventional voltage controlled oscillator shown in FIG. 1, the above-mentioned N is an even number equal to or more than 2, and specifically N is 4. In this case, the ring oscillator (RO) 109 is comprised of first to fourth inversion-type differential amplifiers 109a, 109b, 109c, and 109d. Each of the first to fourth inversion-type differential amplifiers 109a, 109b, 109c, and 109d is comprised of PMOS transistors 121, 122, 123, and 124, and NMOS transistor 125, 126, and 129. The first to fourth inversion-type differential amplifiers 109a, 109b, 109c, and 109d have basically the same circuit structure. Therefore, the circuit structure of the first inversion-type differential amplifier 109a will be described.

The higher side power supply voltage $V_{DD}$ is connected with the source electrodes of the PMOS transistors 121, 122, 123, and 124. The gate electrodes of the PMOS transistors 122 and 123 are connected with the drain electrode and gate electrode of the PMOS transistor 111, respectively. Here, each of the PMOS transistors 122 and 123 constitutes a current mirror circuit with the PMOS transistor 111. The gate electrode of the NMOS transistor 129 is connected with the drain electrode and gate electrode of the NMOS transistor 115. Also, the source electrode of the NMOS transistor 129 is connected with the lower power supply voltage, and generally is grounded. Here, the NMOS transistor 129 constitutes a current mirror circuit with the NMOS transistor 115. The drain electrode of the NMOS transistor 129 is connected with the source electrodes of the NMOS transistors 125 and 126. The drain electrode of the NMOS transistor 125 is connected with the drain electrodes of the PMOS transistors 121 and 122, and the gate electrode of the PMOS transistor 121. The drain electrode of the NMOS transistor 126 is connected with the drain electrodes of the PMOS transistors 123 and 124, and the gate electrode of the PMOS transistor 124.

The gate electrode of the NMOS transistor 125 of the second inversion-type differential amplifier 109b is connected with the drain electrode of the NMOS transistor 125 of the first inversion-type differential amplifier 109a. The gate electrode of the NMOS transistor 126 of the second inversion-type differential amplifier 109b is connected with the drain electrode of the NMOS transistor 126 of the first inversion-type differential amplifier 109a.

Similarly, the gate electrode of the NMOS transistor 125 of the third inversion-type differential amplifier 109c is connected with the drain electrode of the NMOS transistor 125 of the second inversion-type differential amplifier 109b. The gate electrode of the NMOS transistor 126 of the third inversion-type differential amplifier 109c is connected with the drain electrode of the NMOS transistor 126 of the second inversion-type differential amplifier 109b. Also, the gate electrode of the NMOS transistor 125 of the fourth inversion-type differential amplifier 109d is connected with the drain electrode of the NMOS transistor 125 of the third inversion-type differential amplifier 109c. The gate electrode of the NMOS transistor 126 of the fourth inversion-type differential amplifier 109d is connected with the drain electrode of the NMOS transistor 126 of the third inversion-type differential amplifier 109c. Also, the gate electrode of the NMOS transistor 125 of the first inversion-type differential amplifier 109a is connected with the drain electrode of the NMOS transistor 126 of the fourth inversion-type differential amplifier 109d. The gate electrode of the NMOS transistor 126 of the first inversion-type differential amplifier 109a is connected with the drain electrode of the NMOS transistor 125 of the fourth inversion-type differential amplifier 109d. Also, the drain electrode of the NMOS transistor 125 of the fourth inversion-type differential amplifier 109d is connected with the level converter (L-C) 107 through the first output terminal OUT1. The drain electrode of the NMOS transistor 126 of the fourth inversion-type differential amplifier 109d is connected with the level converter (L-C) 107 through the second output terminal OUT2.

Next, the operation of the bias generator (BG) 108 and the ring oscillator (RO) 109 of the above-mentioned voltage controlled oscillator (VCO) 105 will be described with reference to FIG. 1. Here, a reference level is biased to the constant voltage $V_{cnl}$ and a control level is biased to the voltage $V_{cnt}$, which are supplied to the voltage controlled oscillator (VCO) 105.

Referring to FIG. 1, the NMOS transistor 112 flows the drain current ID112 in accordance with the constant voltage $V_{cnl}$ as a bias. However, it is supposed that the drain current ID113 of the NMOS transistor 113 is 0 (A), because the NMOS transistor 113 is now in the off state, or the control voltage $V_{cnt}$ does not reach the threshold voltage. Because the gate and drain of the PMOS transistor 111 are connected to a same node, the PMOS transistor 111 is in the saturation region. At this time, the gate voltage level of the PMOS transistor 111 is equal to the gate levels of the PMOS transistor 114 of the mirror circuit 108b, and each of the PMOS transistor 122 and 123 in each of the first to fourth inversion-type differential amplifiers 109a, 109b, 109c, and 109d in the ring oscillator (RO) 109. Each of the PMOS transistor 114 and the PMOS transistor 122 and 123 in each of the first to fourth inversion-type differential amplifiers 109a, 109b, 109c, and 109d constitutes a current mirror circuit with the PMOS transistor 111. Therefore, the current determined in accordance with the ratio of the gate parameters of the PMOS transistor 111 such as the threshold voltage, the gate length, and the gate thickness of the gate oxidation film and those of each of the PMOS transistors 114, 122 and 123 flows as the drain current of each of the PMOS transistors 114, 122 and 123.

As the drain current ID115 of the NMOS transistor 115, only the drain current ID114 of the PMOS transistor 114 flows which is determined in accordance with the ratio of the gate parameters of the PMOS transistor 111 and those of the PMOS transistor 114. Because the gate and drain of the NMOS transistor 115 are connected to the same node, the NMOS transistor 115 is in the saturation region, and the gate voltage level is determined to flow the drain current ID115. The gate voltage level is equal to the gate level of the NMOS transistor 129 of each of the first to fourth inversion-type differential amplifiers 109a, 109b, 109c, and 109d. The NMOS transistors 129 of each of the first to fourth inversion-type differential amplifiers 109a, 109b, 109c, and 109d constitutes a current mirror circuit with the NMOS transistor 115. Therefore, the current determined in accordance with the ratio of the gate parameters of the NMOS transistor 115 and those of the NMOS transistor 129 flows as the drain current of the NMOS transistor 129.

When the control voltage $V_{cnt}$ rises and becomes equal to or higher than the threshold value of the NMOS transistor 113, the NMOS transistor 113 is turned on. At this time, the drain current ID113 of the NMOS transistor 113 begins to flow. As the voltage $V_{cnt}$ raises, the drain currents ID113 of the NMOS transistor 113 flows more. Therefore, the drain current ID111 of the PMOS transistor 111 increases, too. Consequently, the drain current of each of the PMOS transistors 122 and 123 of the current mirror circuits, and the drain current of the NMOS transistor 129 increase, too.

When the reference level is biased to the constant voltage $V_{cnl}$ and the voltage $V_{cnt}$ is not supplied, the drain current ID129 flows through the NMOS transistor 129 of the first inversion-type differential amplifier 109a. Thus, the drain current ID129 of the NMOS transistor 129 flows through a node where the source electrodes of the NMOS transistors 125 and 126 are connected with the drain electrode of the NMOS transistor 129 in common.

The NMOS transistors 125 and 126 of the differential circuit as a switch operate with the drain current ID129 of the above-mentioned NMOS transistor 129. The NMOS transistors 125 and 126 in the first inversion-type differential amplifier 109a flow the drain currents ID125 and ID126 in accordance with input signals, i.e., output signals from the fourth inversion-type differential amplifier 109d to supply to the PMOS transistors 121 and 124 as active loads. When the NMOS transistor 125 is turned on and the NMOS transistor 126 is turned off, the current flows through the NMOS transistor 125 and the PMOS transistor 121. At this time, the output of the NMOS transistor 125 in the first inversion-type differential amplifier 109a or the input of the NMOS transistor 125 in the second inversion-type differential amplifier 109b becomes low because of the potential drop corresponding to the drain—source voltage VDS121 of the PMOS transistor 121. Because the NMOS transistor 126 is in the off state, the output of the NMOS transistor 126 in the first inversion-type differential amplifier 109a or the input of the NMOS transistor 126 of the second inversion-type differential amplifier 109b becomes high.

The PMOS transistors 122 and 123 connected in parallel as the active loads constitute mirror circuits together with the bias generator (BG) 108. By flowing the mirror current through the mirror circuit, there is an effect that the NMOS transistors 125 and 126 flow currents quickly when the NMOS transistors 125 and 126 are turned on or off. Thus, it is possible to make the rising and falling operations rapid to promote the oscillation at high speed.

When the level of the voltage $V_{cnt}$ supplied to the bias generator (BG) 108 rises, the drain current ID129 of the NMOS transistor 129 of first inversion-type differential amplifier 109 begins to flow. At this time, the circuit current of the first inversion-type differential amplifier 109a increases. If the current increases, the drive ability for the circuit increases. Also, the time taken to charge output load, i.e., the gate capacitances of the NMOS transistor 125 and the NMOS transistor 126 of the second inversion-type differential amplifier 109b and wiring lines capacities can be made short. In other words, a delay time in the first inversion-type differential amplifiers 109a becomes short.

When the NMOS transistor 125 of the first inversion-type differential amplifier 109a is turned on and the NMOS transistor 126 is in the off state, as mentioned above, the output of the NMOS transistor 125 is in the low level and the output of the NMOS transistor 126 is in the high level. Thus, the low level is supplied from the NMOS transistor 125 of the first inversion-type differential amplifier 109a to the NMOS transistor 125 of the second inversion-type differential amplifier 109b. Also, the high level is supplied from the NMOS transistor 126 of the first inversion-type differential amplifier 109a to the NMOS transistor 126 of the second inversion-type differential amplifier 109b. Therefore, the NMOS transistor 125 is turned off and the NMOS transistor 126 is turned on in the second inversion-type differential amplifier 109b. As a result, the output of the NMOS transistor 125 is in the high level and the output of the NMOS transistor 126 is in the low level. Thus, the high level is supplied from the NMOS transistor 125 of the second inversion-type differential amplifier 109b to the NMOS transistor 125 of the third inversion-type differential amplifier 109c. Also, the low level is supplied from the NMOS transistor 126 of the second inversion-type differential amplifier 109b to the NMOS transistor 126 of the third inversion-type differential amplifier 109c. Therefore, the NMOS transistor 125 is turned on and the NMOS transistor 126 is turned off in the third inversion-type differential amplifier 109c. As a result, the output of the NMOS transistor 125 is in the low level and the output of the NMOS transistor 126 is in the high level. Thus, the low level is supplied from the NMOS transistor 125 of the third inversion-type differential amplifier 109c to the NMOS transistor 125 of the fourth inversion-type differential amplifier 109d. Also, the high level is supplied from the NMOS transistor 126 of the third inversion-type differential amplifier 109c to the NMOS transistor 126 of the second inversion-type differential amplifier 109d. Therefore, the NMOS transistor 125 is turned off and the NMOS transistor 126 is turned on in the second inversion-type differential amplifier 109b. As a result, the output of the NMOS transistor 125 is in the high level and the output of the NMOS transistor 126 is in the low level. The high level is supplied from the NMOS transistor 125 of the fourth inversion-type differential amplifier 109d to the NMOS transistor 126 of the first inversion-type differential amplifier 109a. Also, the low level is supplied from the NMOS transistor 126 of the fourth inversion-type differential amplifier 109d to the NMOS transistor 125 of the first inversion-type differential amplifier 109a. By this, the NMOS transistor 125 is turned off and the NMOS transistor 126 is turned on in the first inversion-type differential amplifier 109a. Thus, the high level is supplied from the NMOS transistor 125 of the first inversion-type differential amplifier 109a to the NMOS transistor 125 of the second inversion-type differential amplifier 109b. Also, the low level is supplied from the NMOS transistor 126 of the first inversion-type differential amplifier 109a to the NMOS transistor 126 of the second inversion-type differential amplifier 109b. Therefore, the NMOS transistor 125 is turned on and the NMOS transistor 126 is turned off in the second inversion-type differential amplifier 109b.

As described above, first, the NMOS transistor 125 is in the on state and the NMOS transistor 126 is in the off state in the first inversion-type differential amplifier 109a. However, when a process proceeds for one circulation from the first inversion-type differential amplifier 109a to the fourth inversion-type differential amplifier 109d, the NMOS transistor 125 is turned off and the NMOS transistor 126 is turned on in the first inversion-type differential amplifier 109a. Because this operation continues, the oscillation is carried out.

In the conventional voltage controlled oscillator (VCO) 105, the inclination of the frequency characteristic can be made gentle, because the offset is given to the above-mentioned free-running oscillation frequency $F_{a101}$. Therefore, even when the control voltage $V_{cnt}$ containing a noise component is supplied, the change of the above-mentioned oscillation frequency $F_{b101}$ can be made small, compared with the voltage controlled oscillator in which the offset is not given.

The frequency characteristic of the conventional voltage controlled oscillator (VCO) 105 will be described with reference to FIG. 4. FIG. 4 is a diagram showing the frequency characteristic of the conventional voltage controlled oscillator (VCO).

As shown in FIG. 4, the symbol Y101 shows a frequency characteristic in case of "typ-case". The free-running oscillation frequency $F_{a101}$ in this case is about 500 MHz. The case "typ-case" means a case that there is no manufacture deviation. Such a characteristic is achieved when the threshold voltages $V_{tn}$ of the NMOS transistors corresponding to $V_{a101}$, $V_{a102}$ and $V_{a103}$ in FIG. 14 and the threshold voltages $V_{tp}$ of the PMOS transistors have center values of normal distributions. However, when the deviation during manufacture exists, there are the frequency characteristic in case of "fast-case" shown by the symbol Y101' and the frequency characteristic in case of "slow-case" shown by the symbol Y101". The frequency characteristic in the case of "fast-case" is obtained when the threshold voltages $V_{tn}$ and $V_{tp}$ are lower. At this time, a transistor is turned on earlier, a parasitic capacity becomes few and a signal is sent earlier. The frequency characteristic in the case of "slow-case" is obtained when the threshold voltages $V_{tn}$ and $V_{tp}$ are higher. At this time, the transistor is turned on late, the parasitic capacity is more, and the signal is sent late. Also, sometimes there are the deviations of the threshold voltages $V_{tn}$ and $V_{tp}$.

When a frequency characteristic is determined considering deviation during the manufacture, the upper limit is shown as MAX of the symbol Y101' and the lower limit is shown as MIN of the symbol Y101". Here, it is supposed that the voltage for the output signal $F_{VCO}$ of the desired oscillation frequency $F_{b101}$ is $V_{b101}$ ($V_{a101} < V_{b101} < V_{DD}$), and the oscillation frequency $F_{b101}$ is 1000 MHz. In this condition, in the frequency characteristic in case of "fast-case" shown by the symbol Y101', the free-running oscillation frequency $F_{a102}$ is about 600 MHz. This is faster by about 20%, compared with the frequency characteristic in case of "typ-case" shown by the symbol Y101. However, when the voltage $V_{cnt}$ increases and reaches the voltage $V_{b101}$ in case of the "typ-case" shown by the symbol Y101, it becomes about 1000 MHz. However, in the frequency characteristic in case of "fast-case" shown by the symbol Y101', it has become as much as 1550 MHz which is faster by 55% than the case of "typ-case". In the frequency characteristic in case of "slow-case" shown by the symbol Y101", the free-running oscillation frequency $F_{a103}$ is about 400 MHz. This is later by about 20%, compared with the frequency characteristic in the case of "typ-case" shown by the symbol Y101. However, in the frequency characteristic in the case of "typ-case" shown by the symbol Y101, it becomes about 1000 (MHz) when the voltage $V_{cnt}$ becomes large and becomes the level of $V_{b101}$. However, in the frequency characteristic of "slow-case" shown by the symbol Y101", it becomes as much as 600 MHz which is later by 40% than the case of "typ-case".

In this way, in the conventional voltage controlled oscillator (VCO) 105, the deviation of the frequency characteristic falls within 20% in case of the free-running oscillation. However, when the control voltage $V_{cnt}$ increases, the deviation becomes large to 55% on the side of the upper limit (the frequency characteristic shown by the symbol Y101') and large to 40% on the side of the lower limit (the frequency characteristic shown by the symbol Y101"). This is because many current mirror circuits are used in the voltage controlled oscillator (VCO) 105. The deviation of the oscillation frequency becomes large due to the channel length modulation effect. In the recent LSI, the channel length modulation effect becomes more conspicuous, because the size of the transistor becomes small.

The channel length modulation effect is an effect that the drain current becomes large in accordance with the increase of the drain voltage in the saturation region. This effect changes the drain current in accordance with the change of the drain voltage, resulting in the change of the oscillation frequency.

Nest, the structure of a PLL (phase-Locked loop) circuit using the conventional voltage controlled oscillator (VCO) 105 will be described with reference to FIG. 2. FIG. 2 is a block diagram showing the structure of the PLL circuit using the conventional voltage controlled oscillator (VCO).

As shown in FIG. 2, the PLL circuit is comprised of a phase frequency comparator (PFD) 101, a charge pump 102, a loop filter 103, an offset circuit (OFST) 104, the voltage controlled oscillator (VCO) 105 and a frequency divider 106.

The phase frequency comparator (PFD) 101 compares the input signal $F_{ref}$ and the feedback signal $F_{fb}$ from the frequency divider 106 in phase and frequency, and generates an increment signal UP and a decrement signal DOWN to show an error between these signals. For example, it is supposed that a clock signal front an oscillator (not shown) is used as the input signal $F_{ref}$. The increment signal UP generated by the phase frequency comparator (PFD) 101 has a frequency decrease quantity of the feedback signal $F_{fb}$ to the input signal $F_{ref}$ and a pulse width equivalent to phase delay. Also, the decrement signal DOWN has a frequency increase quantity of the feedback signal $F_{fb}$ to the input signal $F_{ref}$ and a pulse width equivalent to the phase progress. The increment signal UP and the decrement signal DOWN generated by the phase frequency comparator (PFD) 101 are supplied to the charge pump 102.

The charge pump 102 is a charge pump with a single output, and generates a current pulse in accordance with each of the pulse widths of the increment signal UP and the decrement signal DOWN and supplies to the loop filter 103. In response to the current pulse supplied from the charge pump 102, the loop filter 103 charges a capacitor (not shown) and discharges the charge from the capacitor (not shown) and generates the voltage $V_{cnt}$ in accordance with the above-mentioned current pulse. The voltage $V_{cnt}$ generated by this the loop filter 103 is supplied to the voltage controlled oscillator (VCO) 105.

The offset circuit (OFST) 104 generates and supplies the constant voltage $V_{cnl}$ to the bias generator (BG) 108 of the voltage controlled oscillator (VCO) 105. The constant voltage $V_{cnl}$ is supplied from the offset circuit (OFST) 104 to the bias generator (BG) 108 of the voltage controlled oscillator (VCO) 105, and the voltage $V_{cnt}$ is supplied from the loop filter 103. The voltage controlled oscillator (VCO) 105 generates the output signal $F_{VCO}$ to oscillate at a frequency determined in accordance with the constant voltage $V_{cnl}$ supplied from the offset circuit (OFST) 104 and the voltage $V_{cnt}$ supplied from the loop filter 103. This oscillation frequency is indirectly determined based on the addition of the current $I_{cnl}$ determined in accordance with the constant voltage $V_{cnl}$ and the current $I_{cnt}$ determined in accordance with the voltage $V_{cnt}$. In the lock state, the voltage controlled oscillator (VCO) 105 oscillates at the frequency of M (M is a real number) times of the frequency of the input signal $F_{ref}$.

The output signal $F_{VCO}$ generated by the voltage controlled oscillator (VCO) 105 is sent out outside as the output signal of the PLL circuit and is supplied to the frequency divider 106. The frequency divider 106 divides in frequency the output signal $F_{VCO}$ to 1/N and supplies to the phase frequency comparator (PFD) 101.

Next, the operation of the PLL circuit using the conventional voltage controlled oscillator (VCO) 105 will be described.

It is supposed that the phase of the feedback signal $F_{fb}$ fed back from the frequency divider 106 to the phase frequency comparator (PFD) 101 is now late from the phase of the input signal $F_{ref}$. In this case, the phase frequency comparator (PFD) 101 generates the increment signal UP which has a frequency decrease quantity and a pulse width equivalent to the phase delay and supplies to the charge pump 102. The charge pump 102 flows current determined in accordance with increment signal UP to charge the capacitor (not shown) in the loop filter 103. By this, the voltage $V_{cnt}$ generated by the loop filter 103 becomes high. As a result, the oscillation frequency of the output signal $F_{VCO}$ outputted from the voltage controlled oscillator (VCO) 105 rises and the phase of the output signal $F_{VCO}$ progresses and approaches the phase of the input signal $F_{ref}$.

On the other hand, when the phase of the feedback signal $F_{fb}$ is progressive from the phase of the input signal $F_{ref}$, the phase frequency comparator (PFD) 101 generates the decrement signal DOWN which has a frequency increase quantity and a pulse width equivalent to the phase progress and supplies to the charge pump 102. The charge pump 102 discharges the charge from the capacitor (not shown) in the loop filter 103 by dragging current determined in accordance with the decrement signal DOWN. By this, the voltage $V_{cnt}$ outputted from the loop filter 103 becomes low. As a result, the oscillation frequency of the output signal $F_{VCO}$ outputted from the voltage controlled oscillator (VCO) 105 decreases and the phase of the output signal $F_{VCO}$ is delayed and approaches the phase of the input signal $F_{ref}$.

In this way, in the PLL circuit using the conventional voltage controlled oscillator (VCO) 105, the output signal $F_{VCO}$ and the input signal $F_{ref}$ are always compared in frequency and phase, and the feedback control is carried out to correct the phase delay or phase progress of the output signal $F_{VCO}$ if the phase delay or phase progress between the output signal $F_{VCO}$ and the input signal $F_{ref}$ exists. Then, if the phase delay or phase progress falls within a predetermined range, the phase frequency comparator (PFD) 101 generates the increment signal UP and the decrement signal DOWN which have an identical short pulse width. The quantity of the charge charged in and discharged from the capacitor (not shown) in the loop filter 103 becomes equal to balance, and the PLL circuit enters the lock state. In this lock state, the phase of the output signal $F_{VCO}$ is coincident with the phase of the input signal $F_{ref}$. However, in the PLL circuit using the conventional voltage controlled oscillator (VCO) 105, when a noise component is contained in the voltage $V_{cnt}$ outputted from the loop filter 3, because an offset frequency is given the PLL circuit, the change of the desired oscillation frequency can be suppressed small, compared with the PLL circuit in which the offset frequency is not given. However, because many current mirror circuits are used, the deviation of the oscillation frequency due to the deviation in the manufacture cannot be suppressed low.

A frequency synthesizer circuit as another PLL circuit using another conventional voltage controlled oscillator (VCO) is disclosed in Japanese Laid Open Patent application (JP-A-Heisei 8-125531), in which the phase change of an RF modulation signal due to external disturbance can be prevented for good modulation precision. The frequency synthesizer circuit is comprised of an offset signal generating circuit which generates an offset voltage to cancel the frequency change due to an external disturbance signal based on a disturbance signal as a cause to change the frequency of a local oscillation signal outputted from a voltage controlled oscillator. An offset signal adding circuit adds the offset voltage from the offset signal generating circuit to a tuning voltage to supply to the voltage controlled oscillator.

Also, another PLL circuit is disclosed in Japanese Laid Open Patent Application (JP-A-Heisei 11-177416), in which an oscillation frequency is not influenced and the step out of a lock state can be prevented, irrespective of the deviation of the manufacture state, even if a voltage signal changes due to power supply voltage change and temperature change so that control characteristic is changed. This PLL (the phase-locked loop) circuit is comprised of a phase-locked loop circuit section which generates a DC voltage signal from an error signal as the result of phase comparison between an oscillation signal and a reference signal. A voltage controlled oscillation circuit outputs the oscillation signal controlled in frequency in response to the voltage signal level. A manufacture condition detecting section examines device characteristic change caused due to the change of the manufacture condition, and outputs a corresponding process change signal. A voltage offset section sets an offset value such that a center value of the voltage signal is in neighborhood of a level at the time of the frequency lock in response to the supply of the process change signal.

Also, a phase frequency comparator is described in detail in "A 622-MHz CMOS phase-Locked Loop with Precharge-Type Phase Frequency Detector" (Symposium on VLSI Circuits Digest of Technical Papers, (1994), pp. 129–130) by Hiromi Notani.

Many current mirror circuits are contained in the conventional voltage controlled oscillator (VCO) 105. When a transistor with a small size is used like recently, at change factor due to the channel length modulation effect becomes large. Therefore, in the conventional voltage controlled oscillator (VCO), the deviation of the oscillation frequency becomes large, because the channel length modulation effect is added for the number of stages of the current mirror circuits.

As mentioned above, because the deviation of the oscillation frequency is large, there are the following problems in the conventional voltage controlled oscillator (VCO).

The conventional voltage controlled oscillator (VCO) 105 has a large deviation of the oscillation frequency, because the channel length modulation effect is added to the deviation in the manufacture. Even if the control voltage $V_{cnt}$ is increased to the power supply voltage $V_{DD}$ in the frequency characteristic shown by the symbol Y101" in FIG. 4 when a gain is the smallest, there is a fear that the oscillation frequency becomes smaller than the desired frequency $F_{b101}$. Therefore, to achieve the desired frequency $F_{b101}$ even if there is deviation in the manufacture, the gain of conventional voltage controlled oscillator (VCO) 105 needs to be made large (making the frequency characteristic steep). In this case, when the noise component is on the control voltage $V_{cnt}$, the change of the oscillation frequency becomes large.

Also, considering the change of the oscillation frequency changes, it is not possible to widen the range of the oscillation frequency controllable in a range of the control voltage $V_{cnt}$. That is, the conventional voltage controlled oscillator (VCO) 105 cannot secure the controllable frequency range. As shown in FIG. 4, the frequency range of the conventional voltage controlled oscillator (VCO) 105 is shown by the symbol F100. This frequency range F100 shows a range from the free-running oscillation frequency $F_{a102}$ in the frequency characteristic shown by the symbol Y101' to the oscillation frequency when the control voltage $V_{cnt}$ is equal to the power supply voltage $V_{DD}$ in the frequency characteristic shown by the symbol Y101". The desired oscillation frequency $F_{b101}$ is not contained in the frequency range F100.

SUMMARY OF THE INVENTION

Therefore, an object of the present invention is to provide a voltage controlled oscillator and a PLL circuit using it, in which the deviation of an oscillation frequency can be suppressed.

Another object of the present invention is to provide a voltage controlled oscillator and a PLL circuit using it, in which jitter can be reduced.

Still another object of the present invention is to provide a voltage controlled oscillator and a PLL circuit using it, which can take a frequency range more widely.

In an aspect of the present invention, a voltage controlled oscillator includes N (N is an integer equal to or more than 2) inversion-type differential amplifiers and a level converter. The N (N is an integer equal to or more than 2) inversion-type differential amplifiers are connected in a loop such that each of output signals outputted from one of the N inversion-type differential amplifiers has an opposite polarity to a corresponding one of output signals outputted from the next one of the N inversion-type differential amplifiers. The level converter is connected to one of the N inversion-type differential amplifiers as a last inversion-type differential amplifier to generate an oscillation signal from the output signals outputted from the last inversion-type differential amplifier. Each of the N inversion-type differential amplifiers operates in response to a predetermined voltage and a control voltage.

Here, operation current of each of the N inversion-type differential amplifiers is determined based on the predetermined voltage and the control voltage. Also, the operation current of each of the N inversion-type differential amplifiers is directly determined based on a summation of a current determined based on the predetermined voltage and a current determined based on the control voltage.

Also, an offset of a frequency of the oscillation signal is set based o the predetermined voltage, and a frequency of the oscillation signal is determined based on the control voltage in a predetermined voltage range. The frequency of the oscillation signal is proportional to the control voltage in the predetermined voltage range.

Also, the voltage controlled oscillator may further include a bias generator which improves current drive ability of the N inversion-type differential amplifiers.

Also, each of the N inversion-type differential amplifiers may include a differential section, a first current source transistor and a second current source transistor. The differential section is connected to a higher power supply voltage and including a pair of differential operation transistors to operate a differential amplifying operation. The first current source transistor is connected between the differential section and a lower power supply voltage and having a gate supplied with a predetermined voltage. The second current source transistor is connected between the differential section and the lower power supply voltage in parallel to the first current source transistor and having a gate supplied with a control voltage.

In this case, the voltage controlled oscillator (may further include a bias generator which controls the differential amplifying operation of each of the N inversion-type differential amplifiers based on the predetermined voltage. In this case, the bias generator may include a first drive transistor and a specific transistor. The first drive transistor is connected to the lower power supply voltage and having a gate electrode supplied with the predetermined voltage. The specific transistor is connected between the higher power supply voltage and the first drive transistor, and having a gate thereof connected with a drain electrode thereof to be driven by the first drive transistor such that the specific transistor controls the differential amplifying operation of each of the N inversion-type differential amplifiers.

Here, the differential section of each of the N inversion-type differential amplifiers may include a pair of first and second load transistors provided for a corresponding one of the differential operation transistors. The first load transistor is connected between the higher power supply voltage and the corresponding differential operation transistor and has a gate connected to a drain thereof, and the second load transistor is connected between the higher power supply voltage and the corresponding differential operation transistor and has a gate connected to the drain of the specific transistor. It is desirable that the specific transistor and the second load transistor constitute a current mirror circuit.

Also, the bias generator may further include a second drive transistor connected between the lower power supply voltage and the specific transistor in parallel to the first drive transistor and having a gate electrode supplied with the control voltage. The specific transistor is driven by the second drive transistor in addition to the first drive transistor such that the specific transistor controls the differential amplifying operation of each of the N inversion-type differential amplifiers.

Here, the differential section of each of the N inversion-type differential amplifiers may include a pair of first and second load transistors provided for a corresponding one of the differential operation transistors. In this case, the first load transistor is connected between the higher power supply voltage and the corresponding differential operation transistor and has a gate connected to a drain thereof, and the second load transistor is connected between the higher power supply voltage and the corresponding differential operation transistor and has a gate connected to the drain of the specific transistor. It is desirable that the specific transistor and the second load transistor constitute a current mirror circuit.

Also, the differential section of each of the N inversion-type differential amplifiers may include a resistance provided for a corresponding one of the differential operation transistors, and connected between the higher power supply voltage and the corresponding differential operation transistor.

In another aspect of the present invention, a voltage controlled oscillator for generating an oscillation signal, includes an offset section for determining an offset frequency based on a predetermined voltage, and a proportion section for controlling a frequency of the oscillation signal to be proportional to a predetermined voltage. The frequency of the oscillation signal is directly determined based on the predetermined voltage and the control voltage.

In yet another aspect of the present invention, a voltage controlled oscillator for generating an oscillation signal includes an offset means for determining an offset frequency based on a predetermined voltage and a proportion means for controlling a frequency of the oscillation signal to be proportional to a control voltage. The frequency of the oscillation signal is directly determined based on the predetermined voltage and the control voltage. The voltage control oscillator has N inversion-type differential amplifiers, and each of said inversion-type differential amplifiers is directly connected at a single element to either the control voltage or the predetermined voltage.

In still another aspect of the present invention, a phase locked loop (PLL) circuit includes a phase frequency comparator, a control voltage generating section, a voltage controlled oscillator and a frequency divider. The phase frequency comparator compares a reference signal and a feedback signal and generate a difference signal based on the comparison result. The control voltage generating section generates a control voltage in response to the difference signal. The voltage controlled oscillator generates an oscillation signal based on the control voltage and a predetermined voltage. The frequency divider carries out a frequency division to the oscillation signal outputted from the voltage controlled oscillator to produce the feedback signal.

The voltage controlled oscillator may include N (N is an integer equal to or more than 2) inversion-type differential amplifiers and a level converter. The N (N is an integer equal to or more than 2) inversion-type differential amplifiers are connected in a loop such that each of output signals outputted from one of the N inversion-type differential amplifiers has an opposite polarity to a corresponding one of output signals outputted from the next one of the N inversion-type differential amplifiers. The level converter connected to one of the N inversion-type differential amplifiers as a last inversion-type differential amplifier to generate the oscillation signal from the output signals outputted from the last inversion-type differential amplifier. Each of the N inversion-type differential amplifiers operates in response to a predetermined voltage and a control voltage.

Also, operation current of each of the N inversion-type differential amplifiers is directly determined based on a summation of a current determined based on the predetermined voltage and a current determined based on the control voltage.

Also, the PLL circuit may further include a bias generator which improves current drive ability of the N inversion-type differential amplifiers.

Also, each of the N inversion-type differential amplifiers may include a differential section, a first current source transistor, and a second current source transistor. The differential section is connected to a higher power supply voltage and including a pair of differential operation transistors to operate a differential amplifying operation. The first current source transistor is connected between the differential section and a lower power supply voltage and having a gate supplied with a predetermined voltage. The second current source transistor is connected between the differential section and the lower power supply voltage in parallel to the first current source transistor and having a gate supplied with a control voltage. The PLL circuit may further include a bias generator which controls the differential amplifying operation of each of the N inversion-type differential amplifiers based on the predetermined voltage.

In this case, the bias generator may include a first drive transistor and a specific transistor. The first drive transistor is connected to the lower power supply voltage and having a gate electrode supplied with the predetermined voltage. The specific transistor is connected between the higher power supply voltage and the first drive transistor, and having a gate thereof connected with a drain electrode thereof to be driven by the first drive transistor such that the specific transistor controls the differential amplifying operation of each of the N inversion-type differential amplifiers.

In this case, the differential section of each of the N inversion-type differential amplifiers may include a pair of first and second load transistors provided for a corresponding one of the differential operation transistors. The first load transistor is connected between the higher power supply voltage and the corresponding differential operation transistor and has a gate connected to a drain thereof, and the second load transistor is connected between the higher power supply voltage and the corresponding differential operation transistor and has a gate connected to the drain of the specific transistor. Also, it is desirable that the specific transistor and the second load transistor constitute a current mirror circuit.

Also, the bias generator may further include a second drive transistor connected between the lower power supply voltage and the specific transistor in parallel to the first drive transistor and having a gate electrode supplied with the control voltage. The specific transistor is driven by the second drive transistor in addition to the first drive transistor such that the specific transistor controls the differential amplifying operation of each of the N inversion-type differential amplifiers.

In this case, the differential section of each of the N inversion-type differential amplifiers may include a pair of first and second load transistors provided for a corresponding one of the differential operation transistors. The first load transistor is connected between the higher power supply voltage and the corresponding differential operation transistor and has a gate connected to a drain thereof, and the second load transistor is connected between the higher power supply voltage and the corresponding differential operation transistor and has a gate connected to the drain of the specific transistor. It is desirable that the specific transistor and the second load transistor constitute a current mirror circuit.

Also, the differential section of each of the N inversion-type differential amplifiers may include a resistance provided for a corresponding one of the differential operation transistors, and connected between the higher power supply voltage and the corresponding differential operation transistor.

DESCRIPTION OF THE PREFERRED EMBODIMENTS

Hereinafter, a voltage controlled oscillator according to the present invention will be described in detail with reference to the attached drawings.

(First Embodiment)

Figure 1:
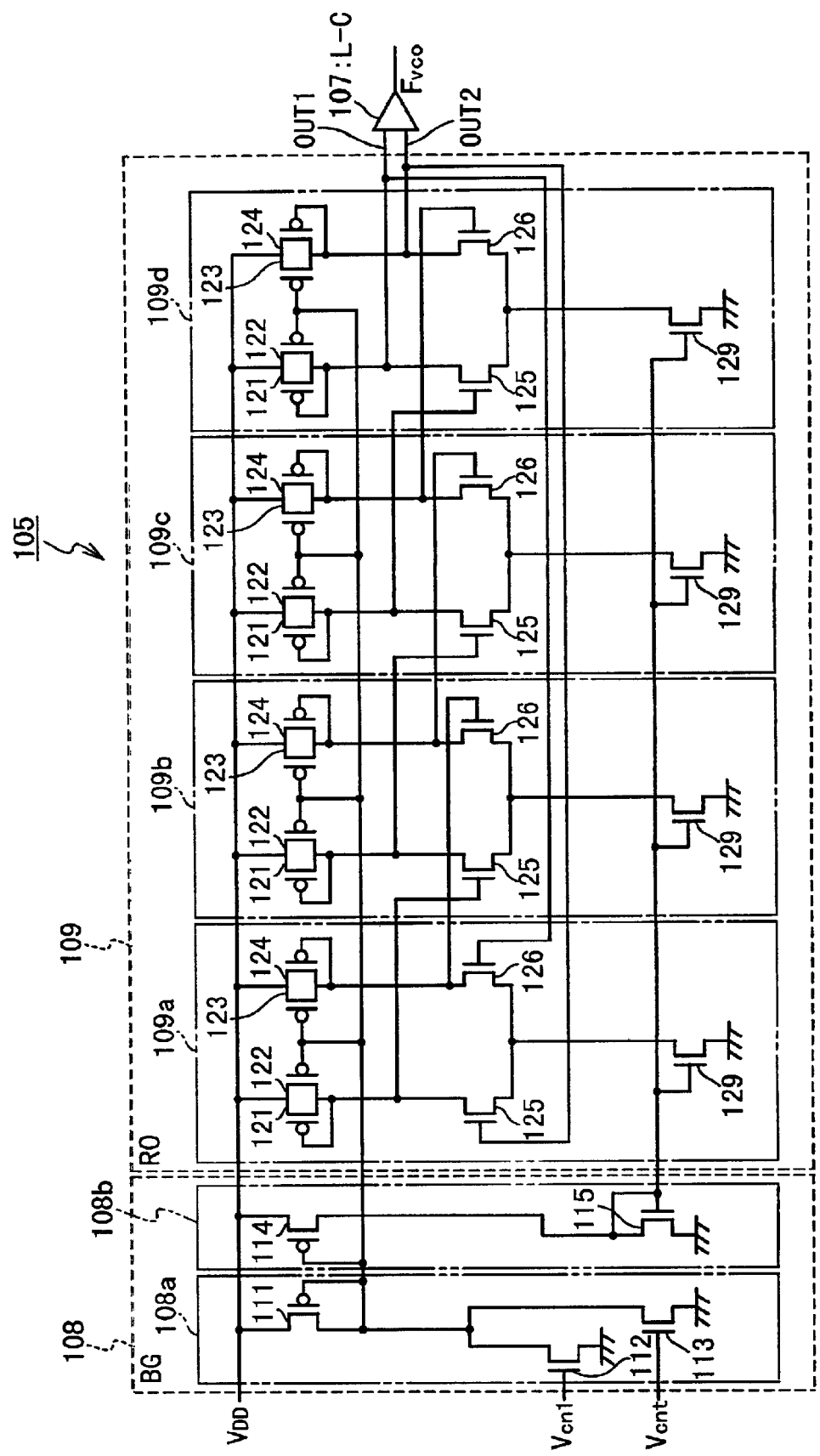
FIG. 1 is a circuit diagram showing the structure of a conventional voltage controlled oscillator (VCO)
Figure 2:
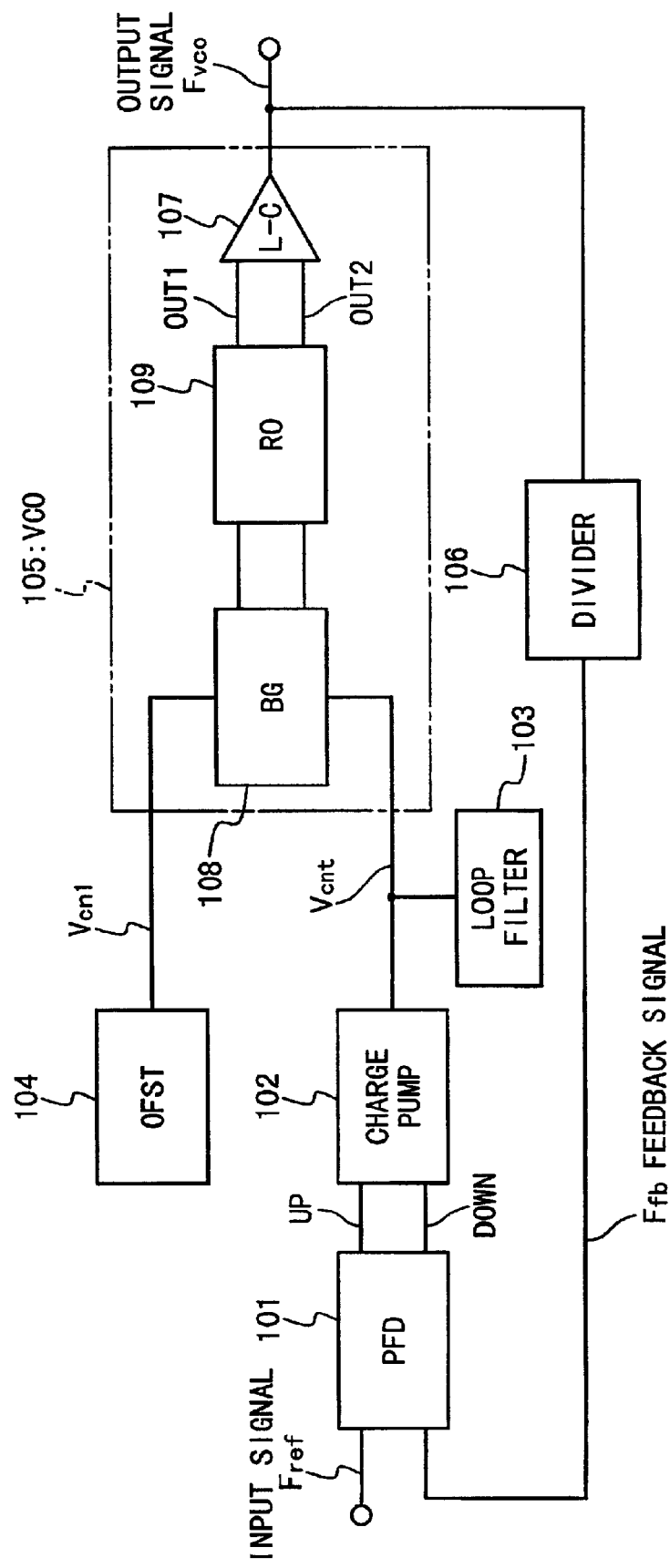
FIG. 2 is a block diagram showing the structure of a PLL circuit using the conventional voltage controlled oscillator (VCO)
Figure 3:
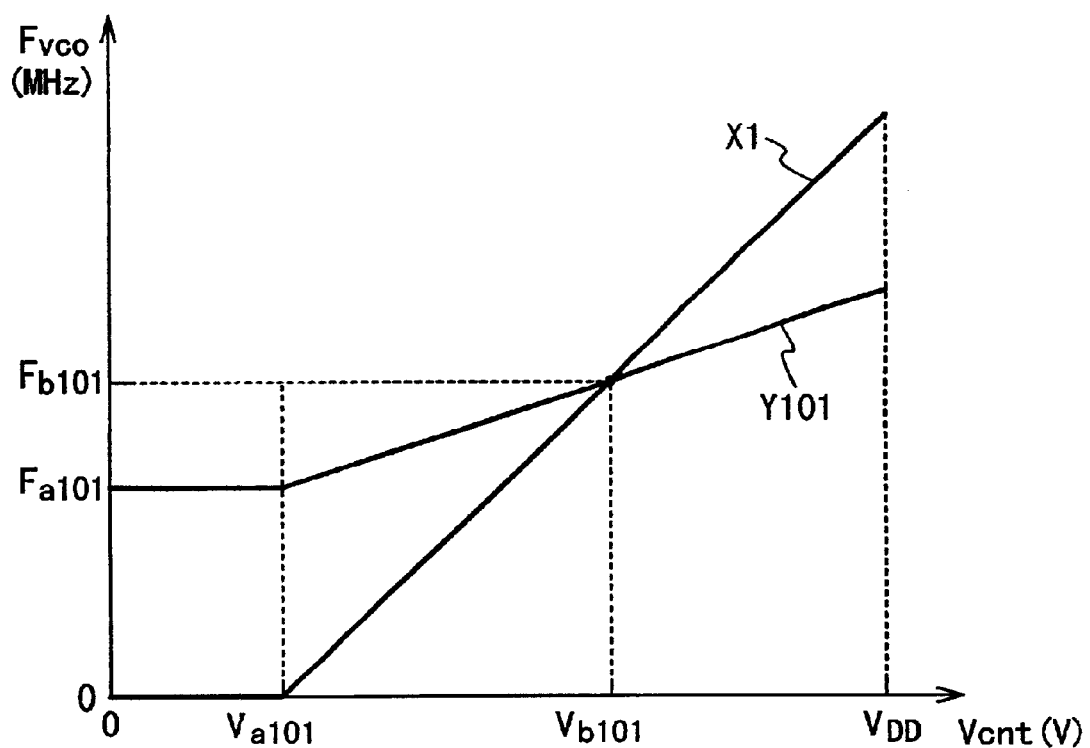
FIG. 3 is a diagram showing a relation of an output signal $F_{VCO}$ and a control voltage $V_{cnt}$.
Figure 4:
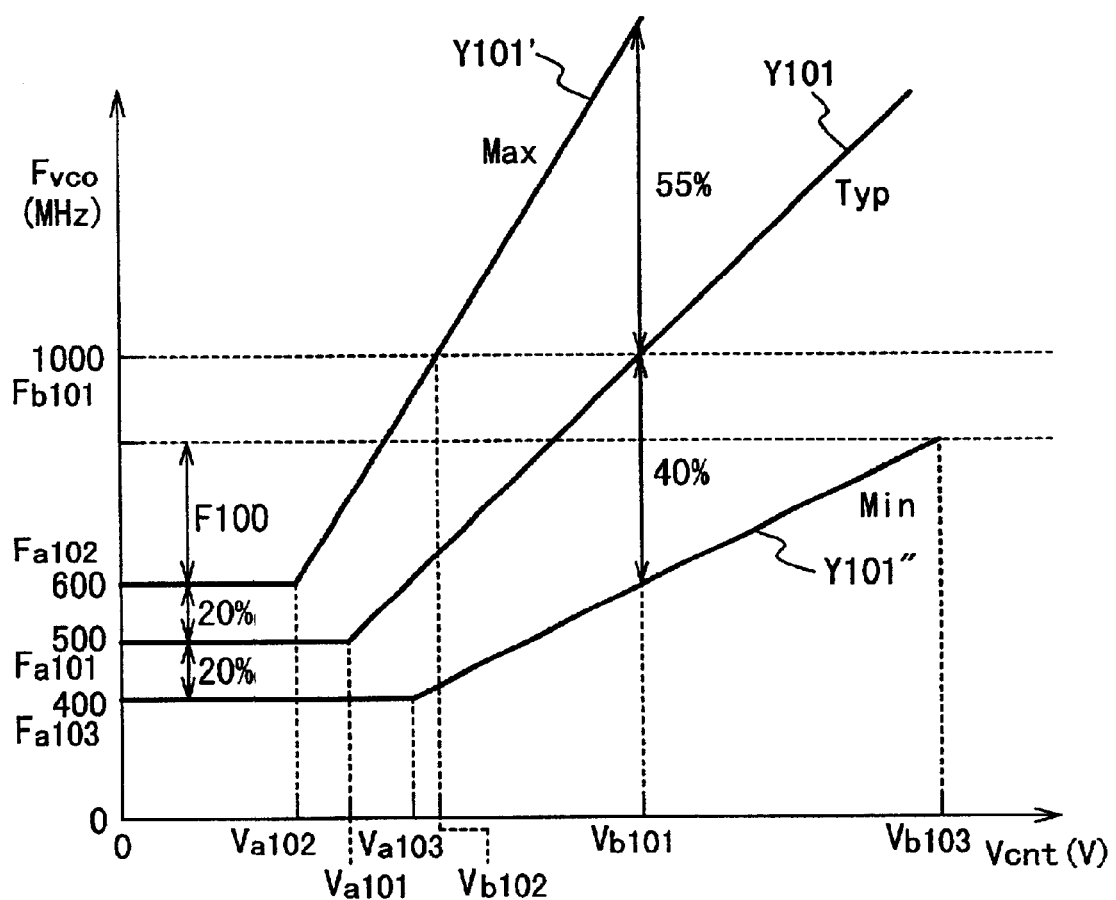
FIG. 4 is a diagram showing a frequency characteristic of the conventional voltage controlled oscillator (VCO)
Figure 5:
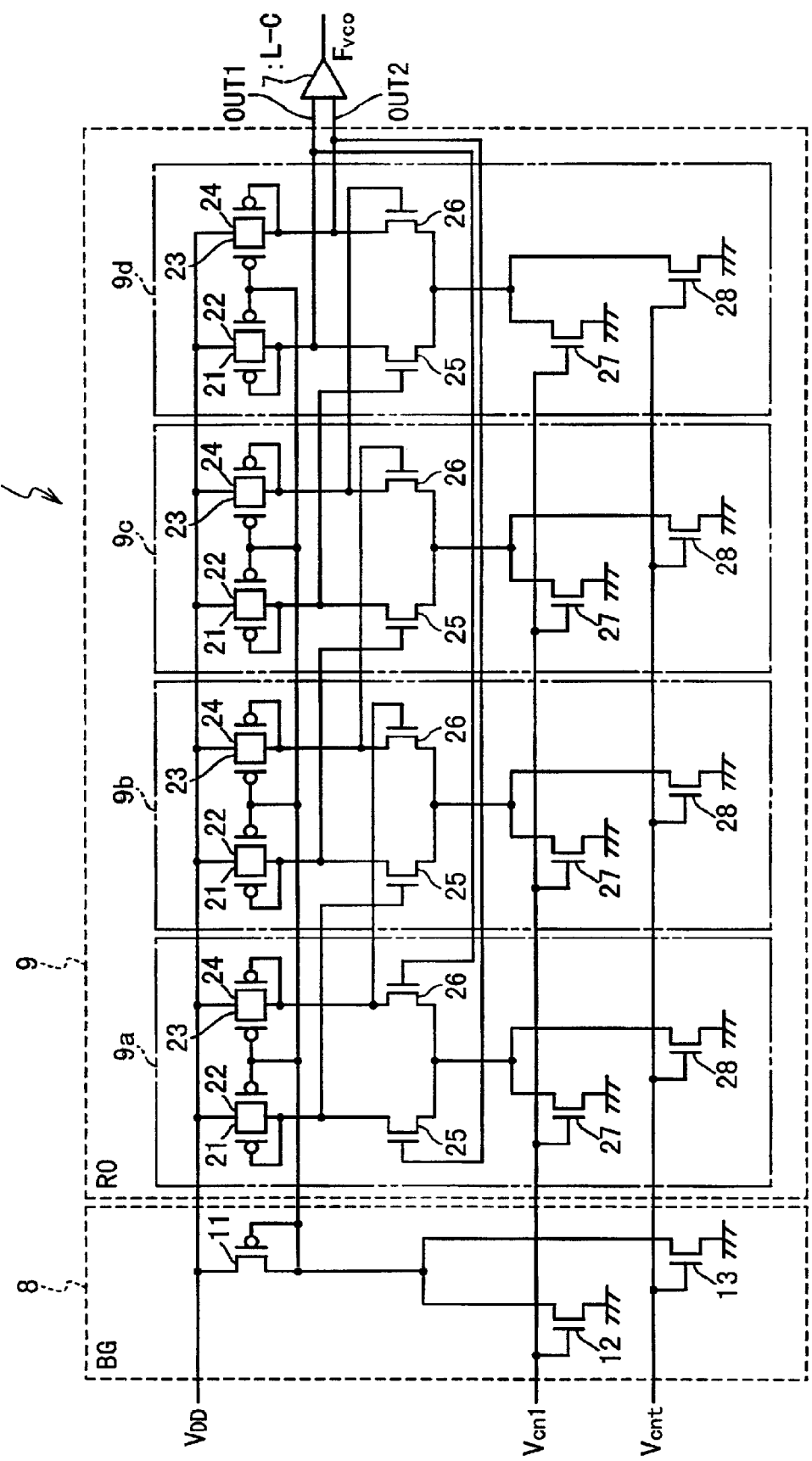
FIG. 5 is a circuit diagram showing the structure of a voltage controlled oscillator (VCO) according to a first embodiment of the present invention.

FIG. 5 is a circuit diagram showing the structure of the voltage controlled oscillator (VCO) according to the first embodiment. As shown in FIG. 5, the voltage controlled oscillator (VCO) 5 according to the first embodiment is comprised of a bias generator (BG) 8, a ring oscillator (RO) 9, and a level converter (L-C) 7.

A constant voltage $V_{cnl}$ with a predetermined voltage value and a control voltage $V_{cnt}$ are supplied to the bias generator (BG) 8 and the ring oscillator (RO) 9 from an external unit. Also, a power supply voltage $V_{DD}$ is supplied to the bias generator (BG) 8 and the ring oscillator (RO) 9 from the external unit. The output of the bias generator (BG) 8 is supplied to the ring oscillator (RO) 9.

The ring oscillator (RO) 9 is comprised of N inversion-type differential amplifiers. Here, N is equal to or more than 2 integers. Each of the N inversion-type differential amplifiers operates in response to the constant voltage $V_{cnl}$ and the control voltage $V_{cnt}$ from the external unit. The operation current of each of the N inversion-type differential amplifiers is directly determined based on the addition value of a current $I_{cnl}$ according to the constant voltage $V_{cnl}$ and a current $I_{cnt}$ according to the control voltage $V_{cnt}$. The bias generator (BG) 8 drives the ring oscillator (RO) 9, e.g., compensates for the operation current of the ring oscillator (RO), 9 based on the current value of current $I_{cnl}$ according to the constant voltage $V_{cnl}$ and current $I_{cnt}$ according to the control voltage $V_{cnt}$. The compensation means promotion of oscillation at high speed by flowing current to raise and fall down an oscillation signal rapidly. By this compensation, it is possible to improve a high frequency characteristic.

Also, in the ring oscillator (RO) 9, an offset frequency is given based on the constant voltage $V_{cnl}$, and the oscillation frequency is controlled to be proportional to the control voltage $V_{cnt}$. A desired oscillation frequency is directly determined based on the addition of the current $I_{cnl}$ according to the constant voltage $V_{cnl}$ and the current $I_{cnt}$ according to the control voltage $V_{cnt}$. The ring oscillator (RO) 9 supplies one of the maximum voltage $V_{OUT1}$ showing the maximum peak of the determined desired oscillation signal and the minimum voltage $V_{OUT2}$ showing the minimum peak thereof to the level converter (L-C) 7 through a first output terminal $V_{OUT1}$, and supplies the other to the level converter (L-C) 7 through a second output terminal OUT2.

The level converter (L-C) 7 increases the voltage difference between the minimum voltage $V_{OUT2}$ and the maximum voltage $V_{OUT1}$ to a voltage level in a range of 0 V to the power supply voltage and generates an output signal $F_{VCO}$. The output signal $F_{VCO}$ generated by the level converter (L-C) 7 is sent out to an external unit as the output signal of the voltage controlled oscillator (VCO) 5.

Figure 8:
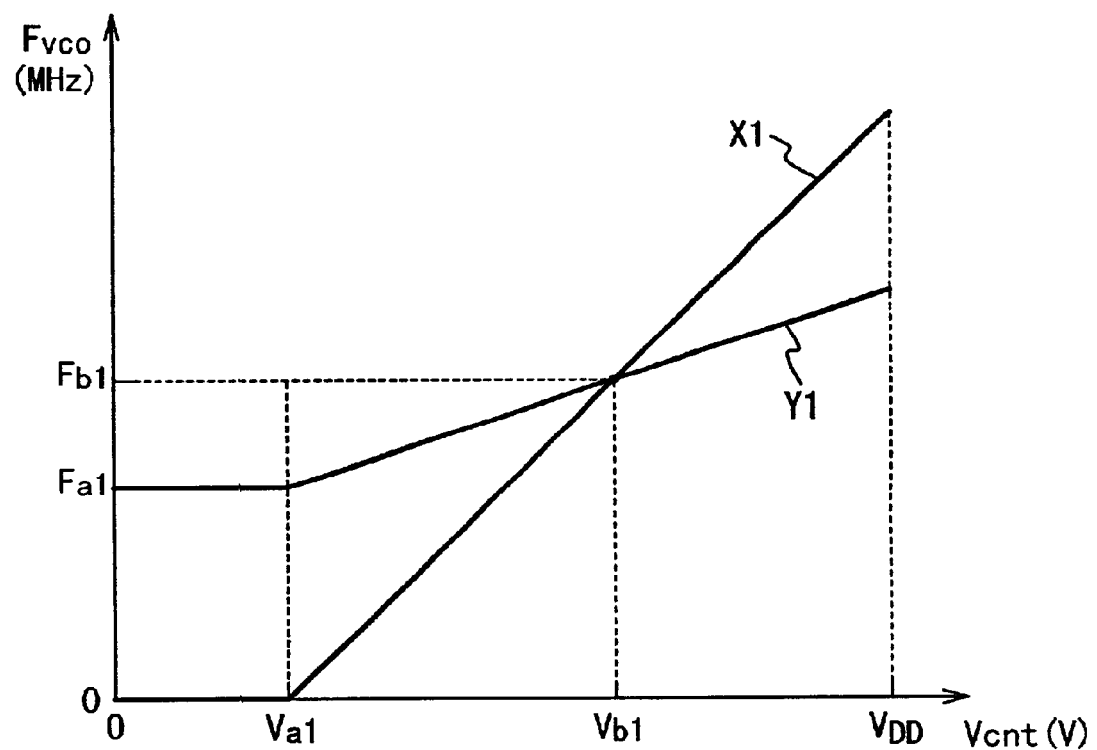
FIG. 8 is a diagram showing a relation of an output signal $F_{VCO}$ and a control voltage $V_{cnt}$.

The oscillation frequency of the output signal $F_{VCO}$ generated by the voltage controlled oscillator (VCO) 5 will be described with reference to FIG. 8. FIG. 8 is a diagram showing a relation of the output signal $F_{VCO}$ and the control voltage $V_{cnt}$.

As shown in FIG. 8, a symbol X1 shows a frequency characteristic as a relation of the output signal $F_{VCO}$ generated by the voltage controlled oscillator (VCO) and control voltage $V_{cnt}$. When the oscillation frequency of the output signal $F_{VCO}$ becomes larger than the threshold voltage $V_{a1}$ of the transistor to be described later which inputs the control voltage $V_{cnt}$ contained in the voltage controlled oscillator (VCO) 5, the symbol X1 shows a linearity in which the oscillation frequency of the output signal $F_{VCO}$ becomes larger than 0 Hz. The voltage controlled oscillator (VCO) 5 determines the oscillation frequency to be proportional to the control voltage $V_{cnt}$ in the range from the threshold voltage Val (e.g., 0.5 (V)) to the power supply voltage $V_{DD}$ and determines the desired oscillation frequency $F_{VCO}'$. At this time, it is supposed that the voltage to get the output signal $F_{VCO}$ of the desired oscillation frequency $F_{b1}$ is $V_{b1}$ ($V_{a1} < V_{b1} < V_{DD}$).

However, when the voltage $V_{b1}$ receives the interference of a noise component from outside and changes, the desired oscillation frequency $F_{b1}$ changes largely according to the inclination of the frequency response (increase of jitter), because the inclination of the frequency characteristic shown by the symbol X1 is steep. To suppress the large change of the oscillation frequency $F_{b1}$, an offset frequency is given to the ring oscillator (RO) 9 by adding the current corresponding to the constant voltage $V_{cnl}$. Thus, the frequency $F_{a1}$ larger than 0 (Hz) and smaller than the desired frequency $F_{b1}$ is set as the reference frequency (free-running oscillation frequency). Therefore, the voltage controlled oscillator (VCO) 5 can generate the frequency characteristic shown by the symbol Y1 and having the inclination more gentle than the frequency characteristic shown by the symbol X1.

Next, the structure of the bias generator (BG) 8 and the ring oscillator (RO) 9 in the voltage controlled oscillator (VCO) 5 in the first embodiment when the above-mentioned N is an even number equal to or more than 2 will be described in detail with reference to FIG. 5.

As shown in FIG. 5, the bias generator (BG) 8 has a P-channel MOS (PMOS) transistor 11 and N-channel MOS (NMOS) transistors 12 and 13. The higher power supply voltage $V_{DD}$ is connected with the source electrode of the PMOS transistor 11. The drain electrode of the PMOS transistor 11 is connected with the drain electrodes of the NMOS transistors 12 and 13. The constant voltage $V_{cnl}$ is supplied to the gate electrode of the NMOS transistor 12 from the external unit. Also, the source electrode of the NMOS transistor 12 is connected with the lower power supply voltage and generally is grounded. The control voltage $V_{cnt}$ is supplied to the gate electrode of the NMOS transistor 13 from the external unit. Also, the source electrode of the NMOS transistor 13 is connected with the lower power supply voltage, and generally is grounded.

Next, the structure of the ring oscillator (RO) 9 will be described.

As shown in FIG. 5, the ring oscillator (RO) 9 is comprised of first inversion-type differential amplifier 9a, a second inversion-type differential amplifier 9b, a third inversion-type differential amplifier 9c, and a fourth inversion-type differential amplifier 9d, when N is 4. Each of the first to fourth inversion-type differential amplifiers 9a to 9d has PMOS transistors 21, 22, 23 and 24, and NMOS transistors 25 and 26 in a differential section, and has an NMOS transistor 27 driven based on the constant voltage $V_{cnl}$ and an NMOS transistor 28 driven based on the control voltage $V_{cnt}$ in a current source section connected with the differential section.

The structure of each of the first to fourth inversion-type differential amplifiers 9a to 9d will be described.

The higher power supply voltage $V_{DD}$ is connected with the source electrode of the PMOS transistors 21, 22, 23 and 24. The gate electrodes of the PMOS transistors 22 and 23 are connected with the drain electrode and the gate electrode of the PMOS transistor 11. Here, the PMOS transistors 22 and 23 constitute a current mirror circuit to the PMOS transistor 11 of the bias generator (BG) 8. The constant voltage $V_{cnl}$ is supplied to the gate electrode of the NMOS transistor 27 from the external unit. Also, the source electrode of the NMOS transistor 27 is connected with the lower power supply voltage and generally is grounded. The control voltage $V_{cnt}$ is supplied to the gate electrode of the NMOS transistor 28 from the external unit. Also, the source electrode of the NMOS transistor 28 is connected with the lower power supply voltage and generally is grounded. The drain electrode of the NMOS transistor 28 is connected with the drain electrode of the NMOS transistor 27, and the source electrodes of the NMOS transistors 25 and 26. The drain electrode of the NMOS transistor 25 is connected with the drain electrodes of the PMOS transistors 21 and 22, and the gate electrode of the PMOS transistor 21. The drain electrode of the NMOS transistor 26 is connected with the drain electrodes of the PMOS transistors 23 and 24, and the gate electrode of the PMOS transistor 24.

The gate electrode of the NMOS transistor 25 of the second inversion-type differential amplifier 9b is connected with the drain electrode of the NMOS transistor 25 of the first inversion-type differential amplifier 9a. The gate electrode of the NMOS transistor 26 of the second inversion-type differential amplifier 9b is connected with the drain electrode of the NMOS transistor 26 of the first inversion-type differential amplifier 9a. The gate electrode of the NMOS transistor 25 of the third inversion-type differential amplifier 9c is connected with the drain electrode of the NMOS transistor 25 of the second inversion-type differential amplifier 9b. The gate electrode of the NMOS transistor 26 of the third inversion-type differential amplifier 9c is connected with the drain electrode of the NMOS transistor 26 of the second inversion-type differential amplifier 9b. The gate electrode of the NMOS transistor 25 of the fourth inversion-type differential amplifier 9d is connected with the drain electrode of the NMOS transistor 25 of the third inversion-type differential amplifier 9c. The gate electrode of the NMOS transistor 26 of the fourth inversion-type differential amplifier 9d is connected with the drain electrode of the NMOS transistor 26 of the third inversion-type differential amplifier 9c. The gate electrode of the NMOS transistor 25 of the first inversion-type differential amplifier 9a is connected with the drain electrode of the NMOS transistor 26 of the fourth inversion-type differential amplifier 9d. The gate electrode of the NMOS transistor 26 of the first inversion-type differential amplifier 9a is connected with the drain electrode of the NMOS transistor 25 of the fourth inversion-type differential amplifier 9d. Also, the drain electrode of the NMOS transistor 25 of the fourth inversion-type differential amplifier 9d is connected with the level converter (L-C) 7 through the first output terminal OUT1. The drain electrode of the NMOS transistor 26 of the fourth inversion-type differential amplifier 9d is connected with the level converter (L-C) 7 through the second output terminal OUT2.

Next, the operation of the bias generator (BG) 8 and the ring oscillator (RO) 9 in the above-mentioned voltage controlled oscillator (VCO) 5 will be is described with reference to FIG. 5. Here, a reference level is biased to the constant voltage $V_{cnl}$ supplied to the voltage controlled oscillator (VCO) 5 and a control level is biased to the control voltage $V_{cnt}$.

First, the operation of the bias generator (BG) 8 will be described. As shown in FIG. 5, the NMOS transistor 12 flows a drain current ID12 in accordance with the bias because the constant voltage $V_{cnl}$ is applied to the gate electrode of the NMOS transistor 12. The control level is biased to the control voltage $V_{cnt}$. However, if the control level is 0 V, the drain current ID13 is 0 (A), because the NMOS transistor 13 is in the off state (the control voltage does not reach threshold voltage). The drain current ID11 of the PMOS transistor 11 is determined based on a summation of the drain current ID12 and the drain current ID13. However, because the drain current ID13 is 0 A, only the drain current ID12 flows. The PMOS transistor is in the saturated region when the gate and the drain are connected to the same node. Therefore, the gate level the PMOS transistor is determined to flow the drain current ID11. This level is equal to the gate level each of the PMOS transistors 22 and 23 of each of the first to fourth inversion-type differential amplifiers 109a, 109b, 109c, and 109d in the ring oscillator (RO) 109. The PMOS transistors 22 and 23 of each of the first to fourth inversion-type differential amplifiers 109a, 109b, 109c, and 109d constitute current mirror circuits with the PMOS transistor 11. Therefore, the current is determined in accordance with the ratio of the gate parameters of the PMOS transistor 11 such as a threshold voltage, a gate length, a thickness of a gate oxidation film in the PMOS transistor 11 and the those of each of the PMOS transistors 22 and 23, and flows as the drain current of each of the PMOS transistors 22 and 23. The PMOS transistor 11 compensates for the operation current of the ring oscillator (RO) 9, or drives the ring oscillator (RO) 9 based on the addition value of the current $I_{cnl}$ corresponding to the constant voltage $V_{cnl}$ and the current $I_{cnt}$ corresponding to the control voltage $V_{cnt}$.

The drain current ID13 of the NMOS transistor 13 flows when the control voltage $V_{cnt}$ of the control level rises and reaches a value equal to or higher than the threshold value of the NMOS transistor 13. As the control voltage $V_{cnt}$ rises, the more drain currents ID13 of the NMOS transistor 13 flows. Therefore, the drain current ID11 of the PMOS transistor 11 increases, too. In this way, the drain currents of the PMOS transistors 22 and 23 of the current mirror circuits increases.

Next, the operation of the ring oscillator (RO) 9 will be described. Here, the operations of the first to fourth inversion-type differential amplifiers 9a to 9d are same.

Therefore, the operation of the first inversion-type differential amplifier 9a will be described as an example.

The reference level is biased to the constant voltage $V_{cnl}$. When the control voltage $V_{cnt}$ is 0 levels, the drain current ID27 flows through the NMOS transistor 27 but the drain current ID28 does not flow through the NMOS transistor 28, because the NMOS transistor 28 is turned off. Therefore, the drain current ID27 of the NMOS transistor 27 flows through a node to which the source electrodes of the NMOS transistors 25 and 26 are connected, although the drain electrodes of the NMOS transistors 27 and 28 are connected in common.

The NMOS transistors 25 and 26 of the differential circuit as a switch operate in accordance with the drain current ID27 of the above-mentioned NMOS transistor 27. The NMOS transistors 25 and 26 flow the drain currents ID25 and ID26 in accordance with the input signals, i.e., the output signals from the fourth inversion-type differential amplifier 9d, to supply to the PMOS transistors 21 and 24 as active loads. When the NMOS transistor 25 is turned on and the NMOS transistor 26 is turned off, the current flows through the NMOS transistor 25 and the current flows through the PMOS transistor 21, too. At this time, the voltage drop VDS21 is caused between the drain and source of the PMOS transistor 21, and the output of the NMOS transistor 25, i.e., the input to the NMOS transistor 25 of the second inversion-type differential amplifier 9b become the low level. Because the NMOS transistor 26 is in the off state, the output the NMOS transistor 26, i.e., the input to the NMOS transistor 26 of the second inversion-type differential amplifier 9b becomes the high level. By this, the ring oscillator (RO) 9 generates a signal with an oscillation frequency determined in accordance with the addition of the current $I_{cnl}$ corresponding to the constant voltage $V_{cnl}$ and the current $I_{cnt}$ corresponding to the control voltage $V_{cnt}$. The oscillation frequency amplitude is as small as about 0.7 V.

The PMOS transistors 22 and 23 are connected in parallel as the active loads and constitute current mirror circuits with the bias generator (BG) 8. There is an effect that the NMOS transistors 25 and 26 flow current quickly by flowing the mirror currents when the NMOS transistors 25 and 26 are turned on or off. The rising operation and falling operation are made speedy, resulting in the oscillation at high speed.

When the control voltage $V_{cnt}$ rises so that the NMOS transistor 28 is turned on to flow the drain current ID218, the circuit current of the first inversion-type differential amplifier 9a increases. If the current increases, the drive ability of the circuit increases. Also, it becomes fast in the time taken to charge and discharge an output load such as wiring line capacities and gate capacities of the NMOS transistor 25 and the NMOS transistor 26 of the second inversion-type differential amplifier 9b, too. In other words, the delay time of the first inversion-type differential amplifier 9a becomes short.

Next, an operation of the ring oscillator (RO) 9 as the oscillator will be described.

When the NMOS transistor 25 is in the on state and the NMOS transistor 26 is in the off state in the first inversion-type differential amplifier 9a, the output of the NMOS transistor 25 is in the low level and the output of the NMOS transistor 26 is in the high level, as mentioned above. The low level is supplied from the NMOS transistor 25 of the first inversion-type differential amplifier 9a to the NMOS transistor 25 of the second inversion-type differential amplifier 9b. Also, the high level is supplied from the NMOS transistor 26 of the first inversion-type differential amplifier 9a to the NMOS transistor 26 of the second inversion-type differential amplifier 9b. With the result of this, the NMOS transistor 25 is turned off and the NMOS transistor 26 is turned on. The output of the NMOS transistor 25 as the input to the NMOS transistor 25 of the third inversion-type differential amplifier 9c is in the high level, and the output of the NMOS transistor 26 as the input to the NMOS transistor 26 of the third inversion-type differential amplifier 9c is in the low level. The high level is supplied from the NMOS transistor 25 of the second inversion-type differential amplifier 9b to the NMOS transistor 25 of the third inversion-type differential amplifier 9c. Also, the low level is supplied from the NMOS transistor 26 of the second inversion-type differential amplifier 9b to the NMOS transistor 26 of the third inversion-type differential amplifier 9c.

As a result of this, the NMOS transistor 25 is turned on and the NMOS transistor 26 is turned off. The output of the NMOS transistor 25 as the inputting to the NMOS transistor 25 of the fourth inversion-type differential amplifier 9d is in the low level, and the output of the NMOS transistor 26 as the input to the NMOS transistor 26 of the fourth inversion-type differential amplifier 9d is in the high level. The low level is supplied from the NMOS transistor 25 of the third inversion-type differential amplifier 9c to the NMOS transistor 25 of the fourth inversion-type differential amplifier 9d. Also, the high level is supplied from the NMOS transistor 26 of the third inversion-type differential amplifier 9c to the NMOS transistor 26 of the fourth inversion-type differential amplifier 9d.

As a result, the NMOS transistor 25 is turned off and the NMOS transistor 26 is turned on. The output of the NMOS transistor 25 as the input to the NMOS transistor 26 of the first inversion-type differential amplifier 9a is in the high level and the output of the NMOS transistor 26 as the input to the NMOS transistor 25 of the first inversion-type differential amplifier 9a is in the low level. The low level is supplied from the NMOS transistor 26 of the fourth inversion-type differential amplifier 9d to the NMOS transistor 25 of the first inversion-type differential amplifier 9a. Also, the high level is supplied from the NMOS transistor 25 of the fourth inversion-type differential amplifier 9d to the NMOS transistor 25 of the first inversion-type differential amplifier 9a. As a result, the NMOS transistor 25 is turned off and the NMOS transistor 26 is turned on. The output of the NMOS transistor 25 as the input to the NMOS transistor 25 of the second inversion-type differential amplifier 9b is in the high level, and the output of the NMOS transistor 26 a the input to the NMOS transistor 26 of the second inversion-type differential amplifier 9b is in the low level.

First, the NMOS transistor 25 of the first inversion-type differential amplifier 9a is in the on state and the NMOS transistor 26 is in the off state. However, when the process proceeds around the circulation from the first inversion-type differential amplifier 9a to the fourth inversion-type differential amplifier 9d), the NMOS transistor 25 is turned off and the NMOS transistor 26 is turned on in the first inversion-type differential amplifier 9a. That is, the output of the fourth inversion-type differential amplifier 9d at the last stage is inverted and fed back to the first inversion-type differential amplifier 9a at the first stage. Because this operation continues, the oscillation is carried out. Because the delay time of each of the first inversion-type differential amplifier 9a to the fourth inversion-type differential amplifier 9d becomes short when the level of the control voltage $V_{cnt}$ rises, as mentioned above, the oscillation frequency becomes high.

Figure 6:
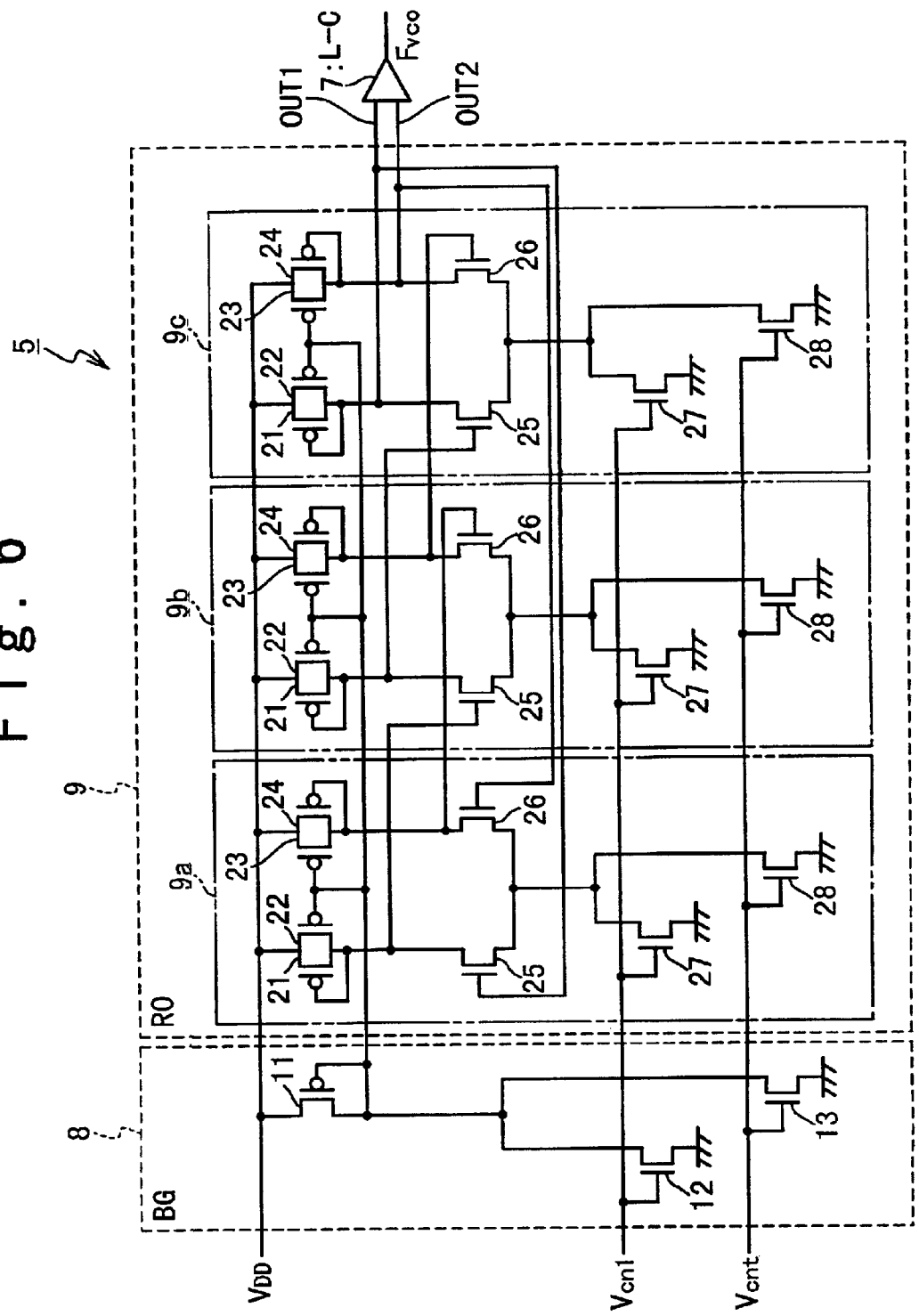
FIG. 6 is a circuit diagram showing another structure of the voltage controlled oscillator (VCO) according to a first embodiment of the present invention.

Also, when the above-mentioned N is an odd number equal to or more than 3, e.g., N is 3, the drain electrode of the NMOS transistor 25 of the third inversion-type differential amplifier 9c is connected with the gate electrode of the NMOS transistor 25 of the first inversion-type differential amplifier 9a and the level converter (L-C) 7 through the first output terminal OUT1, as shown in FIG. 6. Also, the drain electrode of the NMOS transistor 26 is connected with the gate electrode of the NMOS transistor 26 of the first inversion-type differential amplifier 9a and the level converter (L-C) 7 through the second output terminal OUT2. That is, the output of the third inversion-type differential amplifier 9c at the last stage is fed back to the first inversion-type differential amplifier 9a at the first stage.

In the voltage controlled oscillator (VCO) 5 in the first embodiment, the inclination of the frequency characteristic can be made gentle by giving the above-mentioned free-running oscillation frequency $F_{a1}$ as an offset. Therefore, even when the control voltage $V_{cnt}$ containing a noise component is supplied, the change of the above-mentioned oscillation frequency $F_{b1}$ can be made small, compared with the voltage controlled oscillator which does not have the offset. Here, the frequency characteristic of the voltage controlled oscillator (VCO) 5 in the first embodiment will be described with reference to FIG. 9. FIG. 5 is a diagram showing the frequency characteristic of the voltage controlled oscillator (VCO) in the first embodiment.

Figure 9:
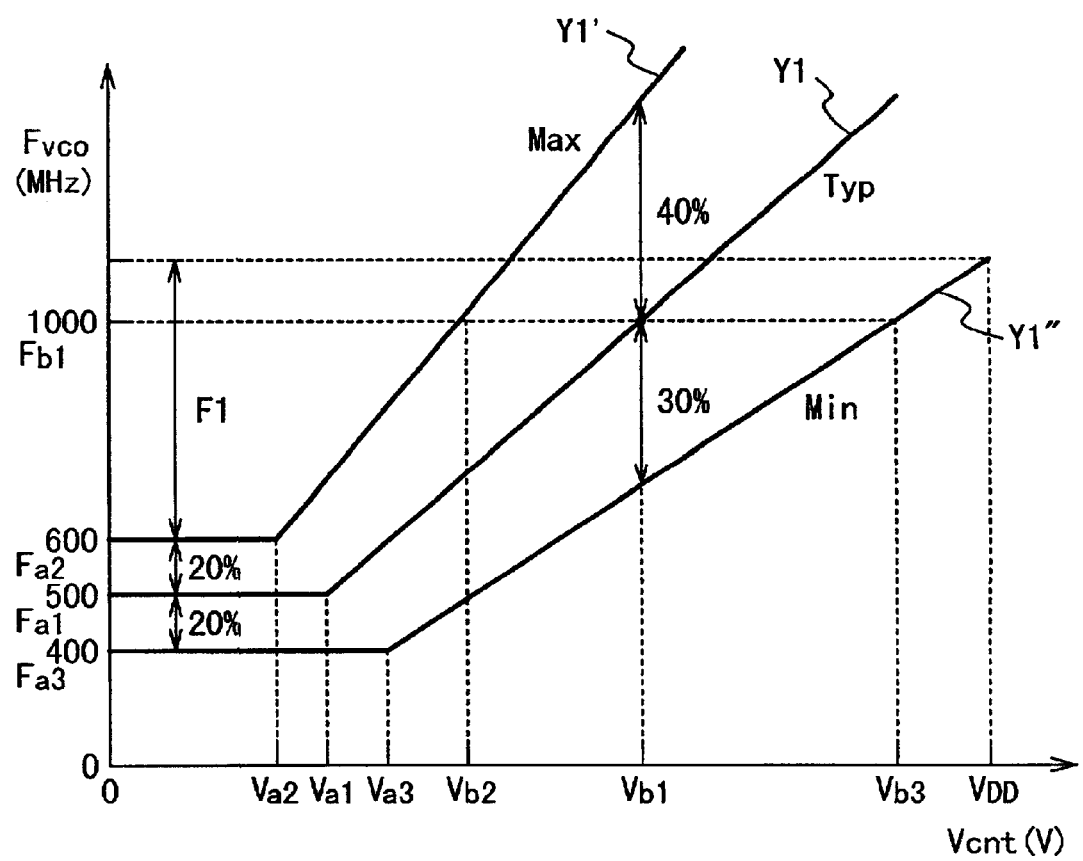
FIG. 9 is a diagram showing the frequency characteristic of the voltage controlled oscillator (VCO) in the first embodiment.

As shown in FIG. 9, the symbol Y1 shows the frequency characteristic in case of "typ-case". The free-running oscillation frequency $F_{a1}$ in this case is about 500 MHz. Also, in case of the deviation on the manufacture, the frequency characteristic in case of "fast-case" shown by the symbol Y1' and the frequency characteristic in case of "slow-case" shown by the symbol Y1" exist.

In the frequency characteristic in the case of "fast-case" shown by the symbol Y1', the free-running oscillation frequency $F_{a2}$ is about 600 MHz. It is supposed that the control voltage $V_{cnt}$ increases and reaches the level $V_{b1}$, which is the voltage to get the output signal $F_{VCO}$ of the desired oscillation frequency $F_{b1}$ of 1000 MHz is $V_{b1}$ ($V_{a1}$<$V_{b1}$<$V_{DD}$). In this case, the oscillation frequency is about 1000 MHz in the frequency characteristic in the case of "typ-case" shown by the symbol Y1, and is 1400 MHz in the frequency characteristic in the case of "fast-case" shown by the symbol Y1'. The value is faster by about 40% than in "typ-case". The free-running oscillation frequency $F_{a3}$ is about 400 MHz in the frequency characteristic of "slow-case" shown by the symbol Y1". When the control voltage $V_{cnt}$ becomes large and reaches the level $V_{b1}$, the free-running oscillation frequency becomes about 1000 MHz in the frequency characteristic of "typ-case" shown by the symbol Y1, and is 600 MHz in the frequency characteristic of "slow-case" shown by the symbol Y1", with the lateness by about 30% than in "typ-case".

In this way, in the frequency characteristic of the conventional voltage controlled oscillator (VCO) 105 when the control voltage $V_{cnt}$ becomes large, the deviation becomes large to 55% on the upper limit side (the frequency characteristic shown by the symbol Y101') and to 40% on the lower limit side (the frequency characteristic shown by the symbol Y101"). On the other hand, in the frequency characteristic of the voltage controlled oscillator (VCO) 5 of the present invention, the deviation is improved by 40% on the upper limit side (the frequency characteristic shown by the symbol Y1') and improved by 30% on the lower limit side (the frequency characteristic shown by the symbol Y1"). Because the voltage controlled oscillator (VCO) 5 in the first embodiment uses only the current mirror circuits for a necessary minimum, influence of the channel length modulation effect does not almost occur and the deviation of the oscillation frequency can be suppressed. Also, a jitter can be reduced because the voltage controlled oscillator (VCO) 5 does not have to increase the gain of the voltage controlled oscillator (VCO) 5. Also, in the voltage controlled oscillator (VCO) 5 in the first embodiment, the minimum frequency range F1 can be secured, even if the control voltage $V_{cnt}$ is not increased to the power supply voltage $V_{DD}$ in the frequency characteristic shown by the symbol Y1" in FIG. 9. This frequency range F1 expresses from the free-running oscillation frequency $F_{a2}$ in the frequency characteristic shown by the symbol Y1' to the oscillation frequency in the frequency characteristic shown by the symbol Y1" when the control voltage $V_{cnt}$ is the power supply voltage $V_{DD}$. The desired oscillation frequency $F_{b1}$ is contained in the frequency range F1. Therefore, the voltage controlled oscillator (VCO) 5 can set the controllable range of the oscillation frequency widely based on the control voltage $V_{cnt}$, considering that the oscillation frequency changes.

Figure 7:
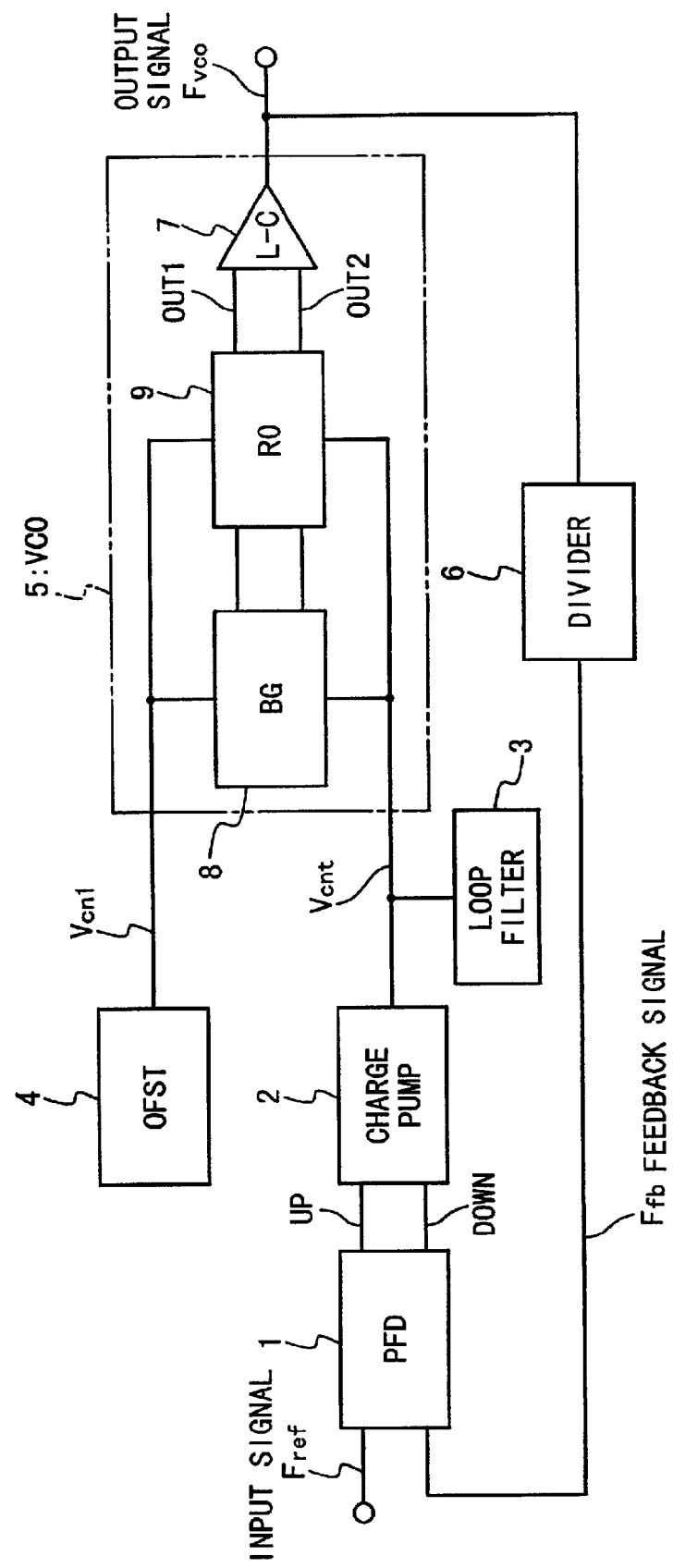
FIG. 7 is a block diagram showing the structure of a PLL circuit using the voltage controlled oscillator (VCO) in the first embodiment.

Next, the structure of a PLL (Phase-Locked Loop) circuit using the voltage controlled oscillator (VCO) 5 in the first embodiment will be described with reference to FIG. 7. FIG. 7 is a block diagram showing the structure of the PLL circuit which used the voltage controlled oscillator (VCO) in the first embodiment.

As shown in FIG. 7, the PLL circuit is comprised of a phase frequency comparator (PFD) 1, a charge pump 2, a loop filter 3, an offset circuit (OFST) 4, the voltage controlled oscillator (VCO) 5 and a frequency divider 6.

The phase frequency comparator (PFD) 1 compares an input signal $F_{ref}$ and a feedback signal $F_{fb}$ from the frequency divider 6 in phase and frequency, and generates an increment signal UP and a decrement signal DOWN to indicate an error between these signals. For example, a clock signal from an oscillator (not shown) is used as the input signal $F_{ref}$. In this case, the increment signal UP generated by the phase frequency comparator (PFD) 1 has a frequency decrease quantity of the feedback signal $F_{fb}$ from the input signal $F_{ref}$ and a pulse width equivalent to a phase delay. Also, the decrement signal DOWN has a frequency increase quantity of the feedback signal $F_{fb}$ from the input signal $F_{ref}$ and a pulse width equivalent to the phase progress. The increment signal UP and the decrement signal DOWN generated by the phase frequency comparator (PFD) 1 are supplied to the charge pump 2.

The charge pump 2 has a single output, and generates an current pulse in accordance with the pulse width of each of the increment signal UP and the decrement signal DOWN to supply to the loop filter 3. The loop filter 3 charges a capacitor (not shown) in response to the current pulse supplied from the charge pump 2 and discharges the charge from the capacitor (not shown), and generates the control voltage $V_{cnt}$ in accordance with the above-mentioned current pulse. The control voltage $V_{cnt}$ generated by the loop filter 3 is supplied to the voltage controlled oscillator (VCO) 5.

The offset circuit (OFST) 4 as a bias circuit generates and supplies the constant voltage $V_{cnl}$ to the bias generator (BG) 8 and the ring oscillator (RO) 9 in the voltage controlled oscillator (VCO) 5. The constant voltage $V_{cnl}$ is supplied from the offset circuit (OFST) 4 to the bias generator (BG) 8 and the ring oscillator (RO) 9 in the voltage controlled oscillator (VCO) 5. The control voltage $V_{cnt}$ is supplied from the loop filter 3. The voltage controlled oscillator (VCO) 5 adds the current $I_{cnl}$ determined based on the constant voltage $V_{cnl}$ supplied from the offset circuit (OFST) 4 and the current $I_{cnt}$ determined based on the control voltage $V_{cnt}$ supplied from the loop filter 3, and generates the output signal $F_{VCO}$ based on the addition result to oscillate at the frequency determined. The oscillation frequency is directly determined based on the addition result of the current $I_{cnl}$ determined based on the constant voltage $V_{cnl}$ and the current $I_{cnt}$ determined based on the control voltage $V_{cnt}$. In the lock state, the voltage controlled oscillator (VCO) 5 oscillates at the frequency of M (M is a real number) times of the frequency of the input signal $F_{ref}$.

The output signal $F_{VCO}$ generated by the voltage controlled oscillator (VCO) 5 is sent out outside as the output signal of the PLL circuit from the level converter (L-C) 7 and is supplied to the frequency divider 6. The frequency divider 6 divides the output signal $F_{VCO}$ to 1/N in frequency and supplies to the phase frequency comparator (PFD) 1.

Next, the operation of the PLL circuit using the voltage controlled oscillator (VCO) 5 in the first embodiment will be described. It is now supposed that the feedback signal $F_{fb}$ fed back from the frequency divider 6 to the phase frequency comparator (PFD) 1 is delayed from the input signal $F_{ref}$ in phase.

In this case, the phase frequency comparator (PFD) 1 generates the increment signal UP which has a frequency decrease quantity and the pulse width equivalent to a phase delay and supplies to the charge pump 2. The charge pump 2 charges the capacitor (not shown) in the loop filter 3 with a current determined in accordance with the increment signal UP. By this, the control voltage $V_{cnt}$ generated by the loop filter 3 becomes high. As a result, the oscillation frequency of the output signal $F_{VCO}$ outputted from the voltage controlled oscillator (VCO) 5 rises, and the phase of the output signal $F_{VCO}$ progresses and approaches the phase of the input signal $F_{ref}$.

On the other hand, when the phase of the feedback signal $F_{fb}$ is progressive more than the phase of the input signal $F_{ref}$, the phase frequency comparator (PFD) 1 generates the decrement signal DOWN which has a frequency increase quantity and the pulse width equivalent to the phase progress, and supplies to the charge pump 2. The charge pump 2 discharges the charges from the capacitor (not shown) in the loop filter 3 by dragging current determined in accordance with the decrement signal DOWN. By this, the control voltage $V_{cnt}$ outputted from the loop filter 3 becomes low. As a result, the oscillation frequency of the output signal $F_{VCO}$ outputted from the voltage controlled oscillator (VCO) 5 falls down, and the phase of the output signal $F_{VCO}$ is delayed and approaches the phase of the input signal $F_{ref}$.

In this way, in the PLL circuit using the voltage controlled oscillator (VCO) 5 in the first embodiment, the phase and frequency of the output signal $F_{VCO}$, and the phase and frequency of the input signal $F_{ref}$ are always compared, and the feedback control is carried out to correct them if the phase delay or the phase progress of the output signal $F_{VCO}$ is present to the input signal $F_{ref}$. Thus, if the phase delay or the phase progress is settled in a predetermined range, the phase frequency comparator (PFD) 1 generates the increment signal UP and the decrement signal DOWN which have an identical short pulse width. The quantities of the charge charged and discharged in and from the capacitor (not shown) in the loop filter 3 become equal and there is balance. In this way, the PLL circuit enters the lock state. In the lock state, the phase of the output signal $F_{VCO}$ is coincident with the phase of the input signal $F_{ref}$. In the PLL circuit using the voltage controlled oscillator (VCO) 5 in the first embodiment, also, an offset frequency is set. Therefore, when a noise component is contained in the control voltage $V_{cnt}$ outputted from the loop filter 3, the change of the desired oscillation frequency can be suppressed small, compared with the circuit in which the offset frequency is not given. Because only the current mirror circuits for the necessary minimum are used, influence of the channel length modulation effect is not almost cause, and the deviation of the oscillation frequency due to the deviation in the manufacture can be suppressed low.

As described above, according to the voltage controlled oscillator (VCO) 5 in the first embodiment, because the current mirror circuits for necessary minimum are used only, influence of the channel length modulation effect is not almost caused and the deviation of the oscillation frequency can be suppressed.

Also, according to the voltage controlled oscillator (VCO) 5 in the first embodiment, a jitter can be reduced, because it is not necessary to increase the gain of the voltage controlled oscillator (VCO) 5.

Also, according to the voltage controlled oscillator (VCO) 5 in the first embodiment, the oscillation frequency range can be set wide in a range in which it is possible to control based on the control voltage $V_{cnt}$, considering the changes of the oscillation frequency.

(Second Embodiment)

Figure 10:
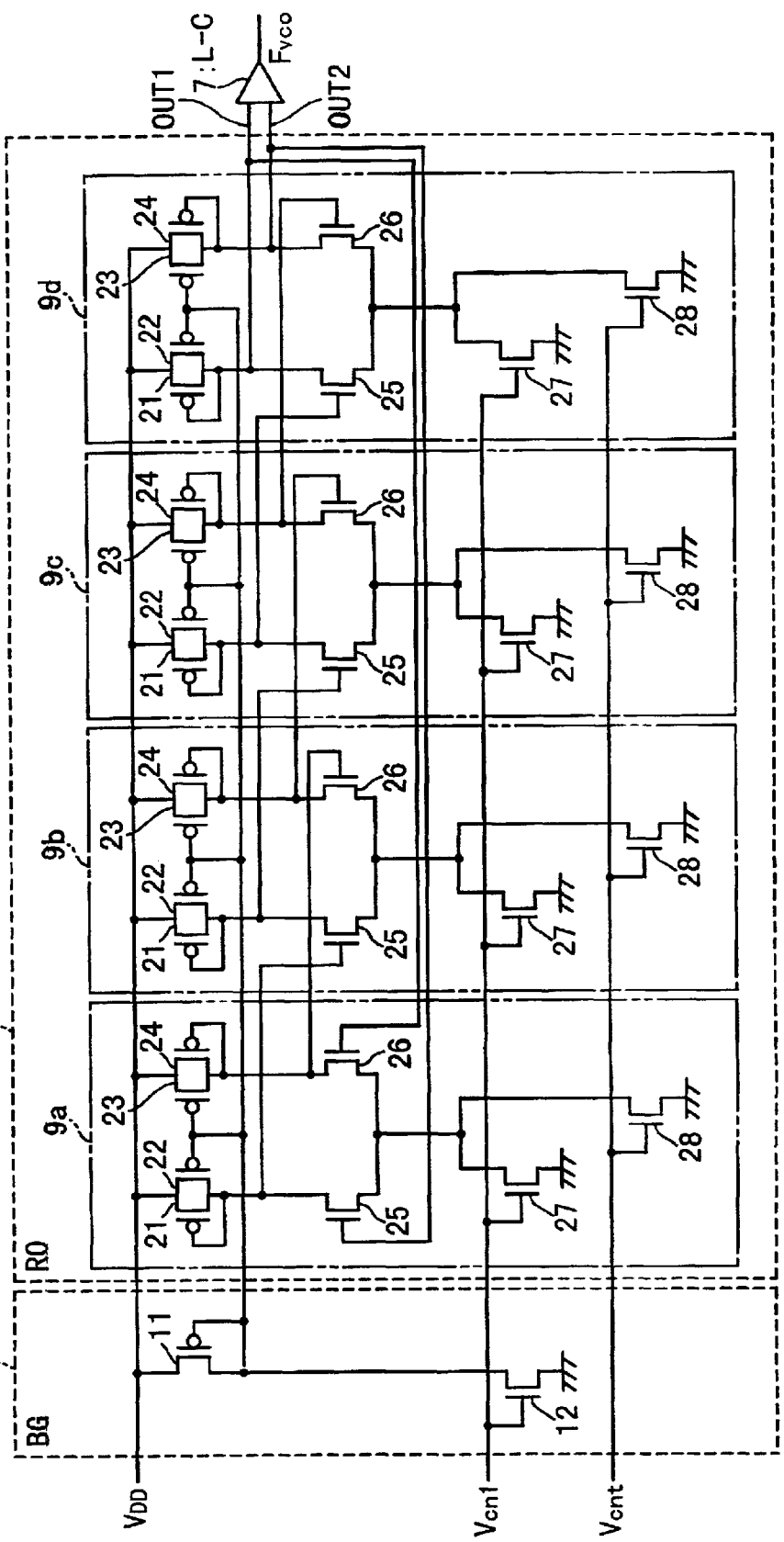
FIG. 10 is a circuit diagram showing the structure of the voltage controlled oscillator (VCO) according to a second embodiment of the present invention.

Next, the voltage controlled oscillator (VCO) in the second embodiment will be described with reference to FIG. 10. As shown in FIG. 10, the voltage controlled oscillator (VCO) 55 according to the second embodiment of the present invention is comprised of a bias generator (BG) 58, a ring oscillator (RO) 9, and a level converter (L-C) 7. That is, in the voltage controlled oscillator (VCO) 55 in the second embodiment, the bias generator (BG) 58 is provided in place of the bias generator (BG) 8. In the voltage controlled oscillator (VCO) 55 in the second embodiment, the same references or signals are allocated to the same components in the first embodiment. Also, the operation of the voltage controlled oscillator (VCO) 55 in the second embodiment is same as the voltage controlled oscillator (VCO) 5 in the first embodiment. Therefore, the description will be omitted.

In the voltage controlled oscillator (VCO) 5 in the first embodiment, the bias generator (BG) 8 compensates for the operation current of the ring oscillator (RO) 9 based on the addition result of the current $I_{cnl}$ determined in accordance with the constant voltage $V_{cnl}$ and the current $I_{cnt}$ determined in accordance with the control voltage $V_{cnt}$. However, in the voltage controlled oscillator (VCO) 55 in the second embodiment, the bias generator (BG) 58 can compensate for the operation current of the ring oscillator (RO) 9 based on only the current $I_{cnl}$ determined in accordance with the constant voltage $V_{cnl}$. By this, in the voltage controlled oscillator (VCO) 55 in the second embodiment, the number of transistors can be reduced more than the voltage controlled oscillator (VCO) 5 in the first embodiment, in addition to the effect of the first embodiment. Therefore, the influence of the deviation in the manufacture can be reduced.

Figure 11:
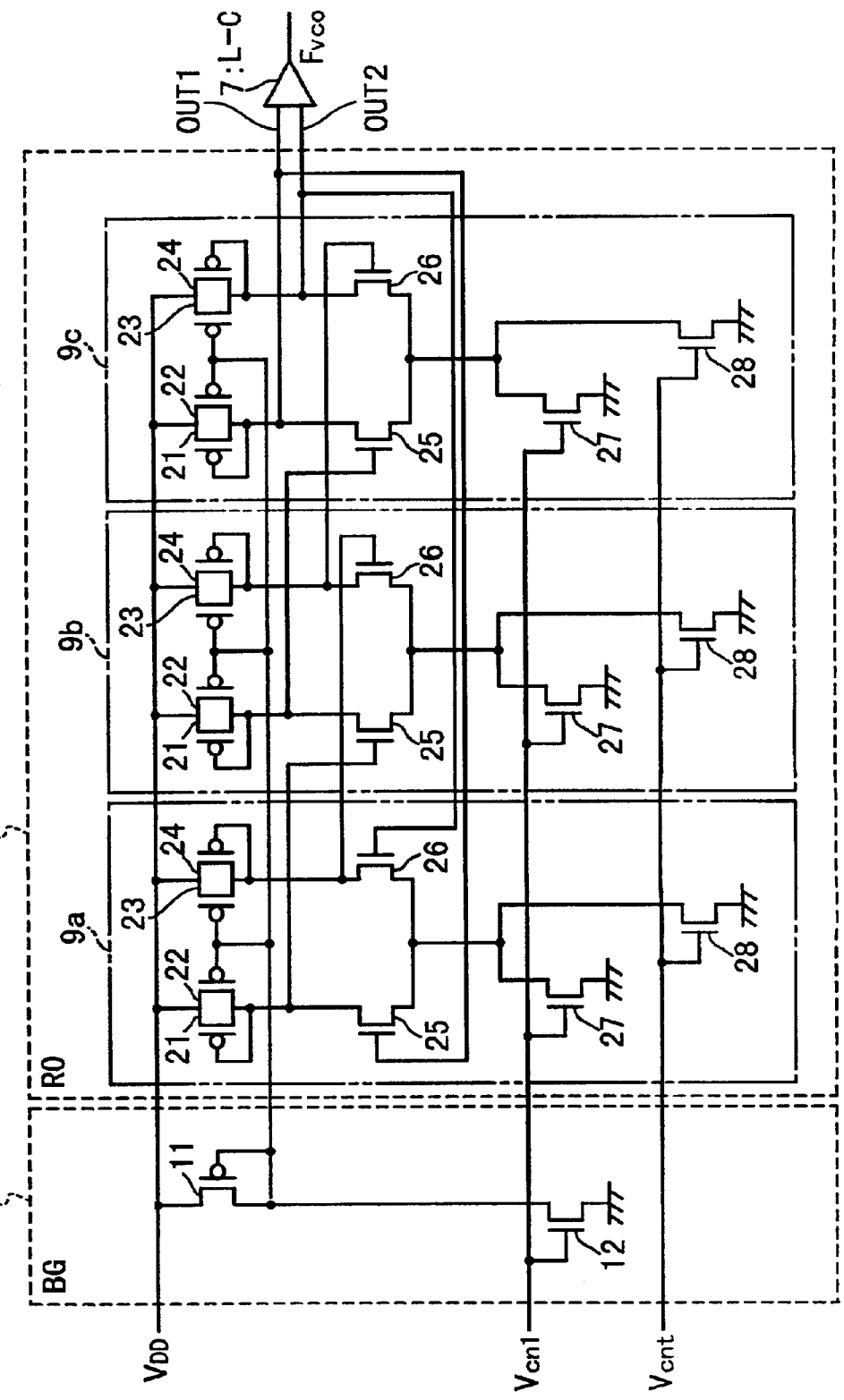
FIG. 11 is a circuit diagram showing another structure of the voltage controlled oscillator (VCO) in the second embodiment.

In this case, the bias generator (BG) 58 has only the PMOS transistor 11, and the NMOS transistor 12. That is, in the bias generator (BG) 58, the NMOS transistor 13 is removed from the bias generator (BG) 8 in the first embodiment. Also, as shown in FIG. 10, when N is an even number equal to or more than 2, e.g., N is 4, the output of the fourth inversion-type differential amplifier 9d at the last stage is fed back to the first inversion-type differential amplifier 9a at the first stage. As shown in FIG. 11, when N is an odd number equal to or more than 3, e.g., N is 3, the output of the third inversion-type differential amplifier 9c at the last stage is fed back to the first inversion-type differential amplifier at the first stage.

It is desirable that the constant voltage $V_{cnl}$ supplied to the voltage controlled oscillator (VCO) 55 is higher than the constant voltage $V_{cnl}$ supplied to the voltage controlled oscillator (VCO) 5 in the first embodiment, to improve the ability by which the bias generator (BG) 58 compensate for the operation current of the ring oscillator (RO) 9.

Figure 12:
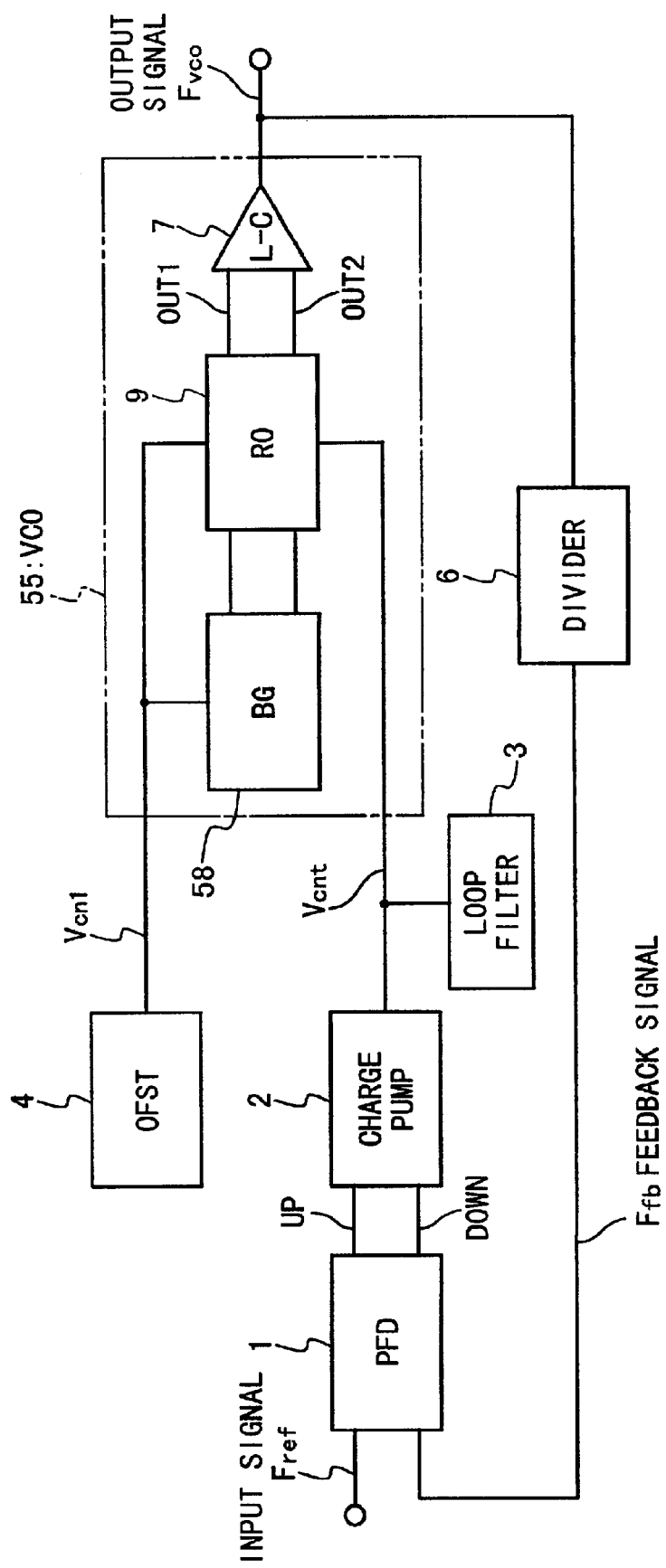
FIG. 12 is a block diagram showing the structure of the PLL circuit using the voltage controlled oscillator (VCO) in the second embodiment.

Also, as shown in FIG. 12, the PLL circuit shown in FIG. 7 can use the voltage controlled oscillator (VCO) 55 in the second embodiment in place of the voltage controlled oscillator (VCO) 5 in the first embodiment. In the PLL circuit using the voltage controlled oscillator (VCO) 55 in the second embodiment, the same reference numerals and signals are allocated to the same components in the first embodiment. Also, the operation of the PLL circuit using the voltage controlled oscillator (VCO) 55 in the second embodiment is same as that of the PLL circuit using the voltage controlled oscillator (VCO) 5 in the first embodiment.

As described above, according to the voltage controlled oscillator (VCO) 55 in the second embodiment, the influence of the deviation in the manufacture can be reduced, because the number of transistors decreases in the voltage controlled oscillator (VCO) 5 in the first embodiment, in addition to the effect of the first embodiment.

(Third Embodiment)

Figure 13:
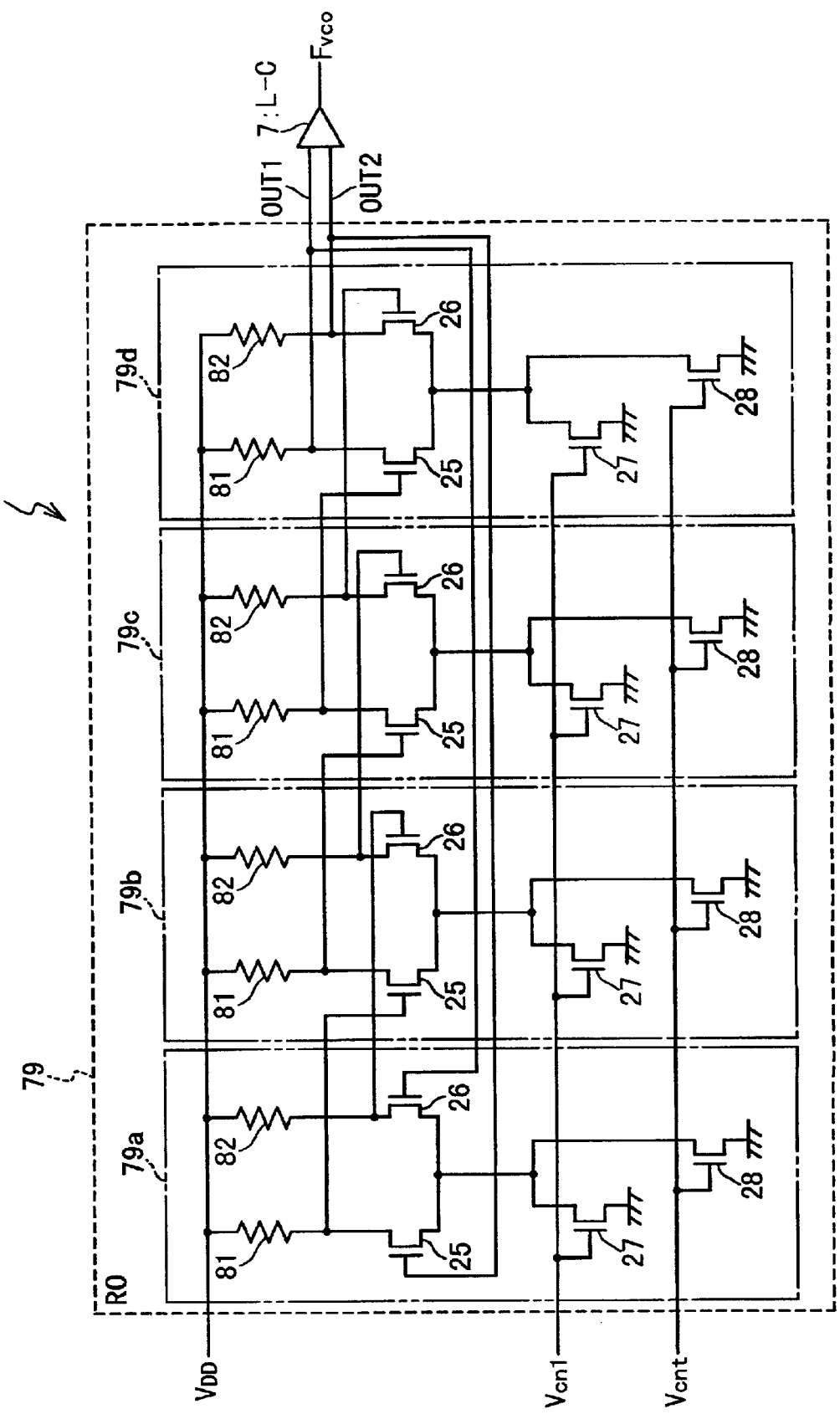
FIG. 13 is a circuit diagram showing the structure of the voltage controlled oscillator (VCO) according to a third embodiment of the present invention.

Next, the voltage controlled oscillator (VCO) in the third embodiment will be described with reference to FIG. 13. As shown in FIG. 13, the voltage controlled oscillator (VCO) 75 in the third embodiment is comprised of the ring oscillator (RO) 79, and the level converter (L-C) 7. In the voltage controlled oscillator (VCO) 75 in the third embodiment, the same reference numerals or signals are allocated to the same components in the first embodiment. Also, because the operation of the voltage controlled oscillator (VCO) 75 in the third embodiment is same as the voltage controlled oscillator (VCO) 5 in the first embodiment, the description will be omitted.

In the voltage controlled oscillator (VCO) 5 in the first embodiment, the bias generator (BG) 8 compensates for the operation current of the ring oscillator (RO) 9 based on the addition result of the current $I_{cnl}$ determined in accordance with the constant voltage $V_{cnl}$ and the current $I_{cnt}$ determined in accordance with the control voltage $V_{cnt}$. However, in the voltage controlled oscillator (VCO) 75 in the third embodiment, the bias generator (BG) 8 is not needed. The circuit structure can be made simple by replacing the PMOS transistor as the active element of the ring oscillator (RO) 9 in the first or second embodiments by a resistance device, compared with the first and second embodiments. By this, in the voltage controlled oscillator (VCO) 75 in the third embodiment, the deviation of the oscillation frequency can be more suppressed, because the current mirror circuit is not used, in addition to the effect of the first embodiment.

Next, the structure of the ring oscillator (RO) 79 will be described. As shown in FIG. 13, the ring oscillator (RO) 79 is comprised of the first inversion-type differential amplifier 79a, the second inversion-type differential amplifier 79b, the third inversion-type differential amplifier 79c, and the fourth inversion-type differential amplifier 79d, when N is 4. Each of the first to fourth inversion-type differential amplifiers 79a to 79d operates based on the constant voltage $V_{cnl}$ from the external unit and the control voltage $V_{cnt}$ from the external unit. The differential section is comprised of resistance devices 81 and 82, and NMOS transistors 25 and 26. The current source connected with the differential section is comprised of an NMOS transistor 27 driven by the constant voltage $V_{cnl}$, and an NMOS transistor 28 driven by the control voltage $V_{cnt}$. The operation current of each of the first inversion-type differential amplifier 79a to the fourth inversion-type differential amplifier 79d is directly determined based on the addition of the current $I_{cnl}$ determined in accordance with the constant voltage $V_{cnl}$ and the current $I_{cnt}$ determined in accordance with the control voltage $V_{cnt}$.

The structure of each of the first inversion-type differential amplifier 79a to the fourth inversion-type differential amplifier 79d will be described. The higher power supply voltage is connected with one of the terminals of each of the resistance devices 81 and 82, and the power supply voltage $V_{DD}$ is supplied. The constant voltage $V_{cnl}$ is supplied to the gate electrode of the NMOS transistor 27 from the external unit. Also, the source electrode of the NMOS transistor 27 is connected with the lower power supply voltage, and generally is grounded. The control voltage $V_{cnt}$ is supplied to the gate electrode of the NMOS transistor 28 from the external unit. Also, the source electrode of the NMOS transistor 28 is connected with the lower power supply voltage, and generally is grounded. The drain electrode of the NMOS transistor 28 is connected with the drain electrode of the NMOS transistor 27, and the source electrodes of the NMOS transistors 25 and 26. The drain electrode of the NMOS transistor 25 is connected with the other terminal of the resistance device 81. The drain electrode of the NMOS transistor 26 is connected with the other terminal of the resistance device 82.

The gate electrode of the NMOS transistor 25 of the second inversion-type differential amplifier 79b is connected with the drain electrode of the NMOS transistor 25 of the first inversion-type differential amplifier 79a. The gate electrode of the NMOS transistor 26 of the second inversion-type differential amplifier 79b is connected with the drain electrode of the NMOS transistor 26 of the first inversion-type differential amplifier 79a. The gate electrode of the NMOS transistor 25 of the third inversion-type differential amplifier 79c is connected with the drain electrode of the NMOS transistor 25 of the second inversion-type differential amplifier 79b. The gate electrode of the NMOS transistor 26 of the third inversion-type differential amplifier 79c is connected with the drain electrode of the NMOS transistor 26 of the second inversion-type differential amplifier 79b. The gate electrode of the NMOS transistor 25 of the fourth inversion-type differential amplifier 79d is connected with the drain electrode of the NMOS transistor 25 of the third inversion-type differential amplifier 79c. The gate electrode of the NMOS transistor 26 of the fourth inversion-type differential amplifier 79d is connected with the drain electrode of the NMOS transistor 26 of the third inversion-type differential amplifier 79c. The gate electrode of the NMOS transistor 25 of the first inversion-type differential amplifier 79a is connected with the drain electrode of the NMOS transistor 26 of the fourth inversion-type differential amplifier 79d. The gate electrode of the NMOS transistor 26 of the first inversion-type differential amplifier 79a is connected with the drain electrode of the NMOS transistor 25 of the fourth inversion-type differential amplifier 79d. Also, the drain electrode of the NMOS transistor 25 of the fourth inversion-type differential amplifier 79d is connected with the level converter (L-C) 7 through the first output terminal OUT1. The drain electrode of the NMOS transistor 26 of the fourth inversion-type differential amplifier 79d is connected with the level converter (L-C) 7 through the second output terminal OUT2.

In this way, the output of the fourth inversion-type differential amplifier 79d at the last stage is fed back to the first inversion-type differential amplifier 79a at the first stage.

Figure 14:
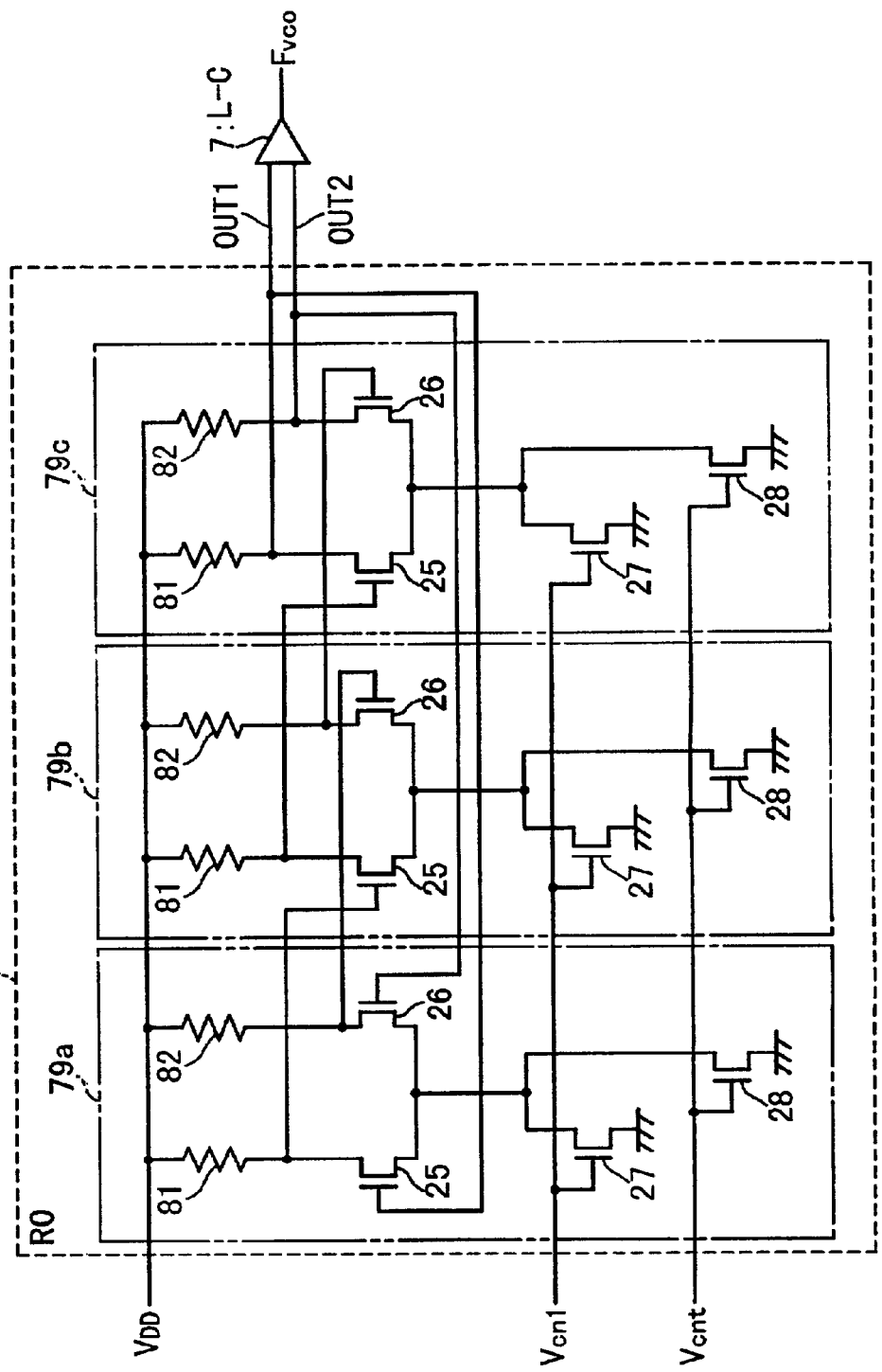
FIG. 14 is a circuit diagram showing another structure of the voltage controlled oscillator (VCO) in the third embodiment.

Also, as shown in FIG. 14, when N is an odd number equal to or more than 3, e.g., N is 3, the output of the third inversion-type differential amplifier 79c at the last stage is fed back to the first inversion-type differential amplifier 79a.

With this, the voltage controlled oscillator (VCO) 75 in the third embodiment can suppress the deviation of the oscillation frequency more, because the current mirror circuit is not used, in addition to the effects of the first and second embodiments.

Figure 15:
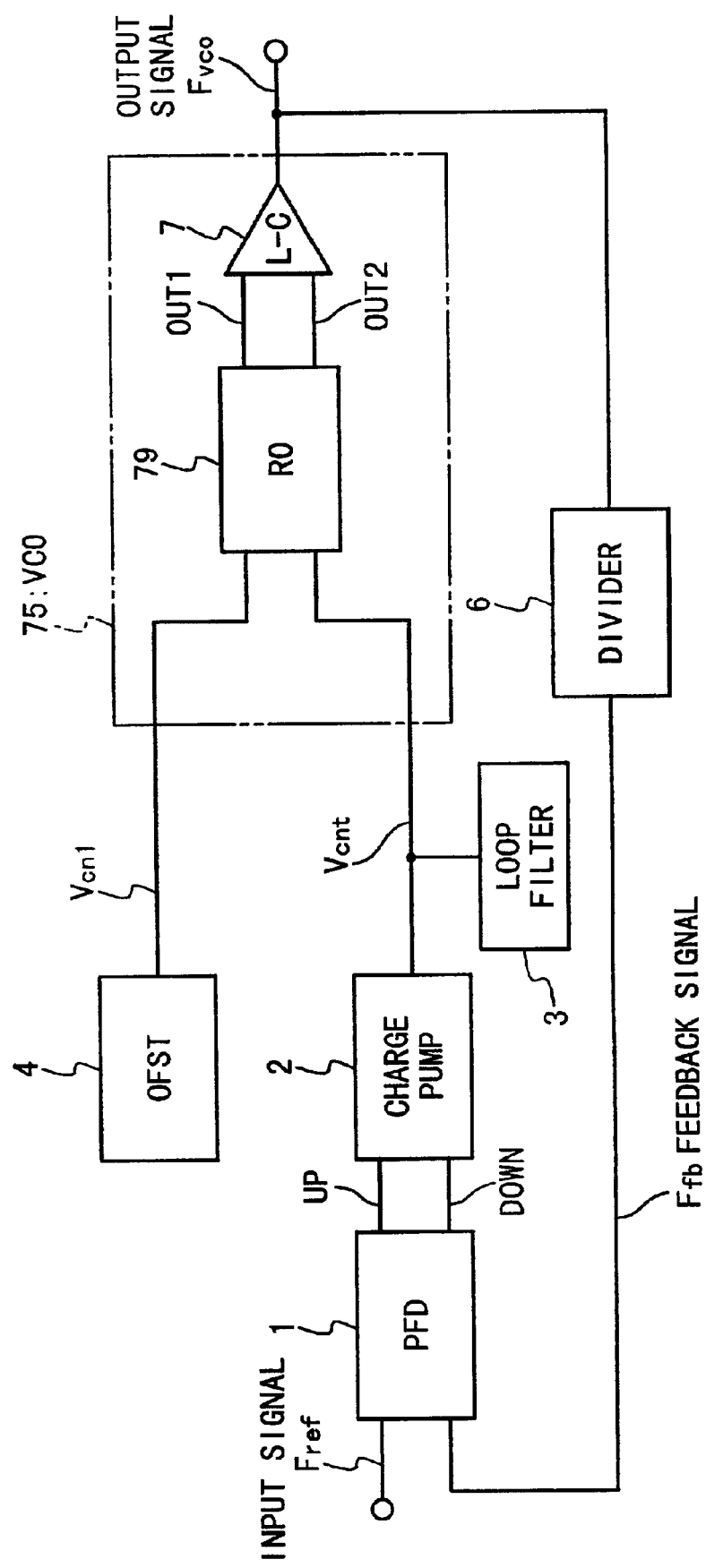
FIG. 15 is a block diagram showing the structure of the PLL circuit using the voltage controlled oscillator (VCO) in the third embodiment.

Also, as shown in FIG. 15, in the third embodiment, the voltage controlled oscillator (VCO) 75 is used in place of the voltage controlled oscillator (VCO) 5 in the first embodiment. In the PLL circuit using the voltage controlled oscillator (VCO) 75 in the third embodiment, the same reference numerals or signals are allocated to the same components in the first embodiment. Also, the operation of the PLL circuit using the voltage controlled oscillator (VCO) 75 in the third embodiment is same as that of the PLL circuit using the voltage controlled oscillator (VCO) 5 in the first embodiment.

As described above, according to the voltage controlled oscillator (VCO) 75 in the third embodiment, the deviation of the oscillation frequency can be more suppressed in addition to the effects of the first and second embodiments, because the current mirror circuits more than necessary minimum are not used in addition to the effect of the first embodiment.

The voltage controlled oscillator of the present invention can suppress the deviation of the oscillation frequency.

What is claimed is:

1. A voltage controlled oscillator comprising:

N (N is an integer equal to or more than 2) inversion-type differential amplifiers connected in a loop such that each of output signals outputted from one of said N inversion-type differential amplifiers has an opposite polarity to a corresponding one of output signals outputted from the next one of said N inversion-type differential amplifiers; and a level converter connected to one of said N inversion-type differential amplifiers as a last inversion-type differential amplifier to generate an oscillation signal from the output signals outputted from said last inversion-type differential amplifier, and wherein each of said N inversion-type differential amplifiers operates in response to a predetermined voltage and a control voltage, and either of said voltages is directly connected to a single element in each of said N inversion-type differential amplifiers, each of said single elements having one terminal grounded.

2. The voltage controlled oscillator according to claim 1, wherein operation current of each of said N inversion-type differential amplifiers is determined based on said predetermined voltage and said control voltage.

3. The voltage controlled oscillator according to claim 2, wherein said operation current of each of said N inversion-type differential amplifiers is directly determined based on a summation of a current determined based on said predetermined voltage and a current determined based on said control voltage.

4. The voltage controlled oscillator according to claim 1, wherein an offset of a frequency of said oscillation signal is set based on said predetermined voltage.

5. The voltage controlled oscillator according to claim 1, wherein a frequency of said oscillation signal is determined based on said control voltage with a predetermined voltage range.

6. The voltage controlled oscillator according to claim 5, wherein said frequency of said oscillation signal is proportional to said control voltage with said predetermined voltage range.

7. The voltage controlled oscillator according to claim 1, further comprising:

a bias generator which improves current drive ability of said N inversion-type differential amplifiers.

8. A voltage controlled oscillator comprising:

N (N is an integer equal to or more than 2) inversion-type differential amplifiers connected in a loop such that each of output signals outputted from one of said N inversion-type differential amplifiers has an opposite polarity to a corresponding one of output signals outputted from the next one of said N inversion-type differential amplifiers; and a level converter connected to one of said N inversion-type differential amplifiers as a last inversion-type differential amplifier to generate an oscillation signal from the output signals outputted from said last inversion-type differential amplifier, and wherein each of said N inversion-type differential amplifiers operates in response to a predetermined voltage and a control voltage, wherein each of said N inversion-type differential amplifiers comprises:

a differential section connected to a higher power supply voltage and including a pair of differential operation transistors to operate a differential amplifying operation;

a first current source transistor connected between said differential section and a lower power supply voltage and having a gate supplied with a predetermined voltage; and a second current source transistor connected between said differential section and said lower power supply voltage in parallel to said first current source transistor and having a gate supplied with a control voltage.

9. The voltage controlled oscillator according to claim 8, further comprising:

a bias generator which controls the differential amplifying operation of each of said N inversion-type differential amplifiers based on said predetermined voltage.

10. The voltage controlled oscillator according to claim 9, wherein said bias generator comprises:

a first drive transistor connected to said lower power supply voltage and having a gate electrode supplied with said predetermined voltage; and a specific transistor connected between said higher power supply voltage and said first drive transistor, and having a gate thereof connected with a drain electrode thereof to be driven by said first drive transistor such that said specific transistor controls the differential amplifying operation of each of said N inversion-type differential amplifiers.

11. The voltage controlled oscillator according to claim 10, wherein said differential section of each of said N inversion-type differential amplifiers comprises:

a pair of first and second load transistors provided for a corresponding one of said differential operation transistors, wherein said first load transistor is connected between said higher power supply voltage and said corresponding differential operation transistor and has a gate connected to a drain thereof, and said second load transistor is connected between said higher power supply voltage and said corresponding differential operation transistor and has a gate connected to said drain of said specific transistor.

12. The voltage controlled oscillator according to claim 11, wherein said specific transistor and said second load transistor constitute a current mirror circuit.

13. The voltage controlled oscillator according to claim 10, wherein said bias generator further comprises:
 a second drive transistor connected between said lower power supply voltage and said specific transistor in parallel to said first drive transistor and having a gate electrode supplied with said control voltage, and
 wherein said specific transistor is driven by said second drive transistor in addition to said first drive transistor such that said specific transistor controls the differential amplifying operation of each of said N inversion-type differential amplifiers.

14. The voltage controlled oscillator according to claim 13, wherein said differential section of each of said N inversion-type differential amplifiers comprises:
 a pair of first and second load transistors provided for a corresponding one of said differential operation transistors, wherein said first load transistor is connected between said higher power supply voltage and said corresponding differential operation transistor and has a gate connected to a drain thereof, and said second load transistor is connected between said higher power supply voltage and said corresponding differential operation transistor and has a gate connected to said drain of said specific transistor.

15. The voltage controlled oscillator according to claim 14, wherein said specific transistor and said second load transistor constitute a current mirror circuit.

16. The voltage controlled oscillator according to claim 8, wherein said differential section of each of said N inversion-type differential amplifiers comprises:
 a resistance provided for a corresponding one of said differential operation transistors, and connected between said higher power supply voltage and said corresponding differential operation transistor.

17. A voltage controlled oscillator for generating an oscillation signal, comprising:
 offset means for determining an offset frequency based on a predetermined voltage; and
 proportion means for controlling a frequency of said oscillation signal to be proportional to a control voltage, and
 wherein the frequency of said oscillation signal is directly determined based on the predetermined voltage and the control voltage, and
 wherein the voltage control oscillator has N inversion-type differential amplifiers, and each of said inversion-type differential amplifiers is directly connected at a single element to either the control voltage or the predetermined voltage.

18. A phase locked loop (PLL) circuit comprising:
 a phase frequency comparator which compares a reference signal and a feedback signal and generate a difference signal based on the comparison result;
 a control voltage generating section which generates a control voltage in response to said difference signal;
 a voltage controlled oscillator which generates an oscillation signal based on said control voltage and a predetermined voltage; and
 a frequency divider which carries out a frequency division to said oscillation signal outputted from said voltage controlled oscillator to produce said feedback signal,
 wherein said voltage controlled oscillator comprises:
 N (N is an integer equal to or more than 2) inversion-type differential amplifiers connected in a loop such that each of output signals outputted from one of said N inversion-type differential amplifiers has an opposite polarity to a corresponding one of output signals outputted from the next one of said N inversion-type differential amplifiers; and
 a level converter connected to one of said N inversion-type differential amplifiers as a last inversion-type differential amplifier to generate said oscillation signal from the output signals outputted from said last inversion-type differential amplifier, and
 wherein each of said N inversion-type differential amplifiers operates in response to a predetermined voltage and a control voltage, and either of said voltages is directly connected to a single element in each of said N inversion-type differential amplifiers, each of said single elements having one terminal grounded.

19. The PLL circuit according to claim 18, wherein operation current of each of said N inversion-type differential amplifiers is directly determined based on a summation of a current determined based on said predetermined voltage and a current determined based on said control voltage.

20. The PLL circuit according to claim 18, further comprising:
 a bias generator which improves current drive ability of said N inversion-type differential amplifiers.

21. A phase locked loop (PLL) circuit comprising:
 a phase frequency comparator which compares a reference signal and a feedback signal and generate a difference signal based on the comparison result;
 a control voltage generating section which generates a control voltage in response to said difference signal;
 a voltage controlled oscillator which generates an oscillation signal based on said control voltage and a predetermined voltage; and
 a frequency divider which carries out a frequency division to said oscillation signal outputted from said voltage controlled oscillator to produce said feedback signal,
 wherein said voltage controlled oscillator comprises:
 N (N is an integer equal to or more than 2) inversion-type differential amplifiers connected in a loop such that each of output signals outputted from one of said N inversion-type differential amplifiers has an opposite polarity to a corresponding one of output signals outputted from the next one of said N inversion-type differential amplifiers; and
 a level converter connected to one of said N inversion-type differential amplifiers as a last inversion-type differential amplifier to generate said oscillation signal from the output signals outputted from said last inversion-type differential amplifier, and
 wherein each of said N inversion-type differential amplifiers operates in response to a predetermined voltage and a control voltage,
 wherein each of said N inversion-type differential amplifiers comprises:
 a differential section connected to a higher power supply voltage and including a pair of differential operation transistors to operate a differential amplifying operation;
 a first current source transistor connected between said differential section and a lower power supply voltage and having a gate supplied with a predetermined voltage; and
 a second current source transistor connected between said differential section and said lower power supply voltage in parallel to said first current source transistor and having a gate supplied with a control voltage.

22. The PLL circuit according to claim 21, further comprising:
a bias generator which controls the differential amplifying operation of each of said N inversion-type differential amplifiers based on said predetermined voltage.

23. The PLL circuit according to claim 22, wherein said bias generator comprises:
a first drive transistor connected to said lower power supply voltage and having a gate electrode supplied with said predetermined voltage; and
a specific transistor connected between said higher power supply voltage and said first drive transistor, and having a gate thereof connected with a drain electrode thereof to be driven by said first drive transistor such that said specific transistor controls the differential amplifying operation of each of said N inversion-type differential amplifiers.

24. The PLL circuit according to claim 23, wherein said differential section of each of said N inversion-type differential amplifiers comprises:
a pair of first and second load transistors provided for a corresponding one of said differential operation transistors, wherein said first load transistor is connected between said higher power supply voltage and said corresponding differential operation transistor and has a gate connected to a drain thereof, and said second load transistor is connected between said higher power supply voltage and said corresponding differential operation transistor and has a gate connected to said drain of said specific transistor.

25. The PLL circuit according to claim 24, wherein said specific transistor and said second load transistor constitute a current mirror circuit.

26. The PLL circuit according to claim 23, wherein said bias generator further comprises:
a second drive transistor connected between said lower power supply voltage and said specific transistor in parallel to said first drive transistor and having a gate electrode supplied with said control voltage, and
wherein said specific transistor is driven by said second drive transistor in addition to said first drive transistor such that said specific transistor controls the differential amplifying operation of each of said N inversion-type differential amplifiers.

27. The PLL circuit according to claim 26, wherein said differential section of each of said N inversion-type differential amplifiers comprises:
a pair of first and second load transistors provided for a corresponding one of said differential operation transistors, wherein said first load transistor is connected between said higher power supply voltage and said corresponding differential operation transistor and has a gate connected to a drain thereof, and said second load transistor is connected between said higher power supply voltage and said corresponding differential operation transistor and has a gate connected to said drain of said specific transistor.

28. The PLL circuit according to claim 27, wherein said specific transistor and said second load transistor constitute a current mirror circuit.

29. The PLL circuit according to claim 21, wherein said differential section of each of said N inversion-type differential amplifiers comprises:
a resistance provided for a corresponding one of said differential operation transistors, and connected between said higher power supply voltage and said corresponding differential operation transistor.

* * * * *